United States Patent
Rathinasamy et al.

(10) Patent No.: US 12,225,681 B2
(45) Date of Patent: Feb. 11, 2025

(54) TRANSCEIVER HANDLE HEAT DISSIPATION AIRFLOW CHANNELING SYSTEM

(71) Applicant: Dell Products L.P., Round Rock, TX (US)

(72) Inventors: Shree Rathinasamy, Round Rock, TX (US); Victor Teeter, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 183 days.

(21) Appl. No.: 18/094,008

(22) Filed: Jan. 6, 2023

(65) Prior Publication Data
US 2024/0237266 A1 Jul. 11, 2024

(51) Int. Cl.
*H05K 7/20* (2006.01)
*G02B 6/42* (2006.01)

(52) U.S. Cl.
CPC ....... *H05K 7/20145* (2013.01); *G02B 6/4269* (2013.01); *H05K 7/20163* (2013.01); *H05K 7/20409* (2013.01); *H05K 7/20454* (2013.01)

(58) Field of Classification Search
CPC ........... H05K 7/20145; H05K 7/20163; H05K 7/20409; H05K 7/20454; G02B 6/4266–4273
See application file for complete search history.

(56) References Cited

U.S. PATENT DOCUMENTS

| | | | | |
|---|---|---|---|---|
| 7,242,580 | B1 * | 7/2007 | Tanaka | H05K 7/20736 361/679.48 |
| 8,794,848 | B2 * | 8/2014 | Sasaki | G02B 6/4261 385/53 |
| 9,929,500 | B1 * | 3/2018 | Ista | H01R 13/6271 |
| 10,073,230 | B2 * | 9/2018 | Wilcox | H04B 10/40 |
| 10,617,034 | B2 * | 4/2020 | Hubahib Gaviola | H05K 1/0203 |
| 11,194,106 | B2 * | 12/2021 | Matsui | H04B 10/40 |
| 2022/0014393 | A1 * | 1/2022 | Singal | H04W 72/23 |
| 2023/0389232 | A1 * | 11/2023 | Ahamed | G02B 6/4269 |
| 2024/0168246 | A1 * | 5/2024 | Ista | G02B 6/4269 |

FOREIGN PATENT DOCUMENTS

GB 2578781 A * 5/2020 .......... G02B 6/4256

* cited by examiner

*Primary Examiner* — Zachary Pape
(74) *Attorney, Agent, or Firm* — Joseph Mencher

(57) ABSTRACT

A transceiver handle heat dissipation airflow channeling system includes a transceiver device having a transceiver device chassis, at least one heat producing component that is housed in the transceiver device chassis, and a transceiver device handle that extends from the transceiver device chassis and that defines an airflow channel along its length. The transceiver device handle receives airflow at an airflow channel entrance defined by the transceiver device handle, directs the airflow through the airflow channel, and dissipates heat generated by the heat producing component(s) using the airflow directed through the airflow channel. For example, the airflow may be directed through the airflow channel and adjacent the heat producing component(s) in the transceiver device chassis, adjacent a heat dissipation device that is integrated with the transceiver device chassis, or adjacent a heat dissipation device that extends from a transceiver device port to which the transceiver device is connected.

20 Claims, 36 Drawing Sheets

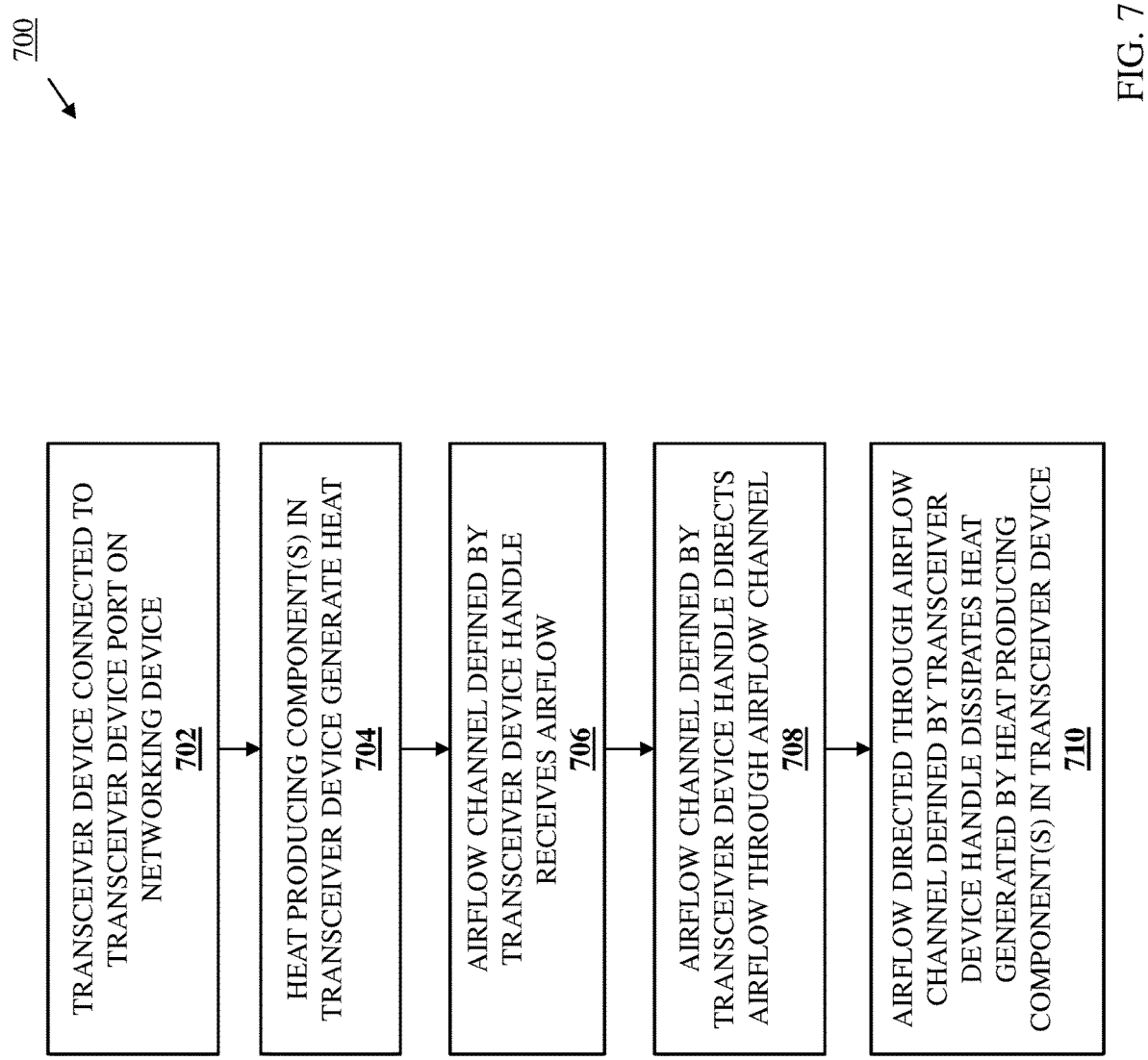

TRANSCEIVER HANDLE HEAT DISSIPATION AIRFLOW CHANNELING SYSTEM

BACKGROUND

The present disclosure relates generally to information handling systems, and more particularly to a transceiver device handle that channels airflow to dissipate heat generated by a transceiver device in an information handling system.

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems such as, for example, switch devices, router device, and/or other networking devices known in the art sometimes utilize transceiver devices to transmit data between computing devices in a networked system. For example, optical transceiver devices may be coupled to switch devices in order to convert between electrical signals and optical signals for use in communications in electrical/fiber optic networked systems. The demand for higher speeds for communications is driving the development higher-power transceiver devices (e.g., high-speed, Quad Small Form-factor Pluggable Double Density (QSFP-DD) transceiver devices) to support up to 800 Gbps connectivity in future communication systems. As will be appreciated by one of skill in the art in possession of the present disclosure, the increased power and transmission speeds of such transceiver devices can raise some issues.

As will be appreciated by one of skill in the art in possession of the present disclosure, the transmission of data by such transceiver devices may result in the generation of relatively significant amounts of heat that requires dissipation. Conventional solutions to dissipate the heat generated by transceiver devices include integrating heat dissipation devices on the transceiver device chassis, immersion cooling (e.g., in liquid cooled racks), conduction cooling (e.g., in air cooled racks), etc. Furthermore, in addition to the cooling challenges presented by the increasing power and data transmission speeds of transceiver devices, cabling techniques (and particularly poor cable management practices) may hinder airflow to transceiver devices that would otherwise be used to cool those transceiver devices. For example, in a data center environment where multiple switch devices may be positioned in a stack (e.g., in a rack), poor cable management practices may result in rack cabling creating a barrier of cables that prevent the airflow from reaching transceivers devices and/or the heat dissipation devices integrated with those transceivers, particularly to transceiver devices positioned "lower" in the stack/rack (i.e., when the cables are run from the top of the rack to the bottom of the rack before routing them through the datacenter).

Accordingly, it would be desirable to provide a transceiver device cooling system that addresses the issues discussed above.

SUMMARY

According to one embodiment, an Information Handling System (IHS) includes a processing system; and a memory system that is coupled to the processing system and that includes instructions that, when executed by the processing system, cause the processing system to provide a networking engine that is configured to perform networking functionality; a first transceiver device port that is coupled to the processing system; and a transceiver device that is connected to the first transceiver device port, wherein the transceiver device includes: at least one heat producing component; and a transceiver device handle that defines an airflow channel along its length, wherein the transceiver device handle is configured to: receive airflow at an airflow channel entrance of the airflow channel; direct the airflow through the airflow channel; and dissipate heat generated by the at least one heat producing component using the airflow directed through the airflow channel.

BRIEF DESCRIPTION OF THE DRAWINGS

FIG. 7 is a flow chart illustrating an embodiment of a method for dissipating heat generated by a transceiver device using airflow channeled via a transceiver device handle.

DETAILED DESCRIPTION

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

Figure 1:
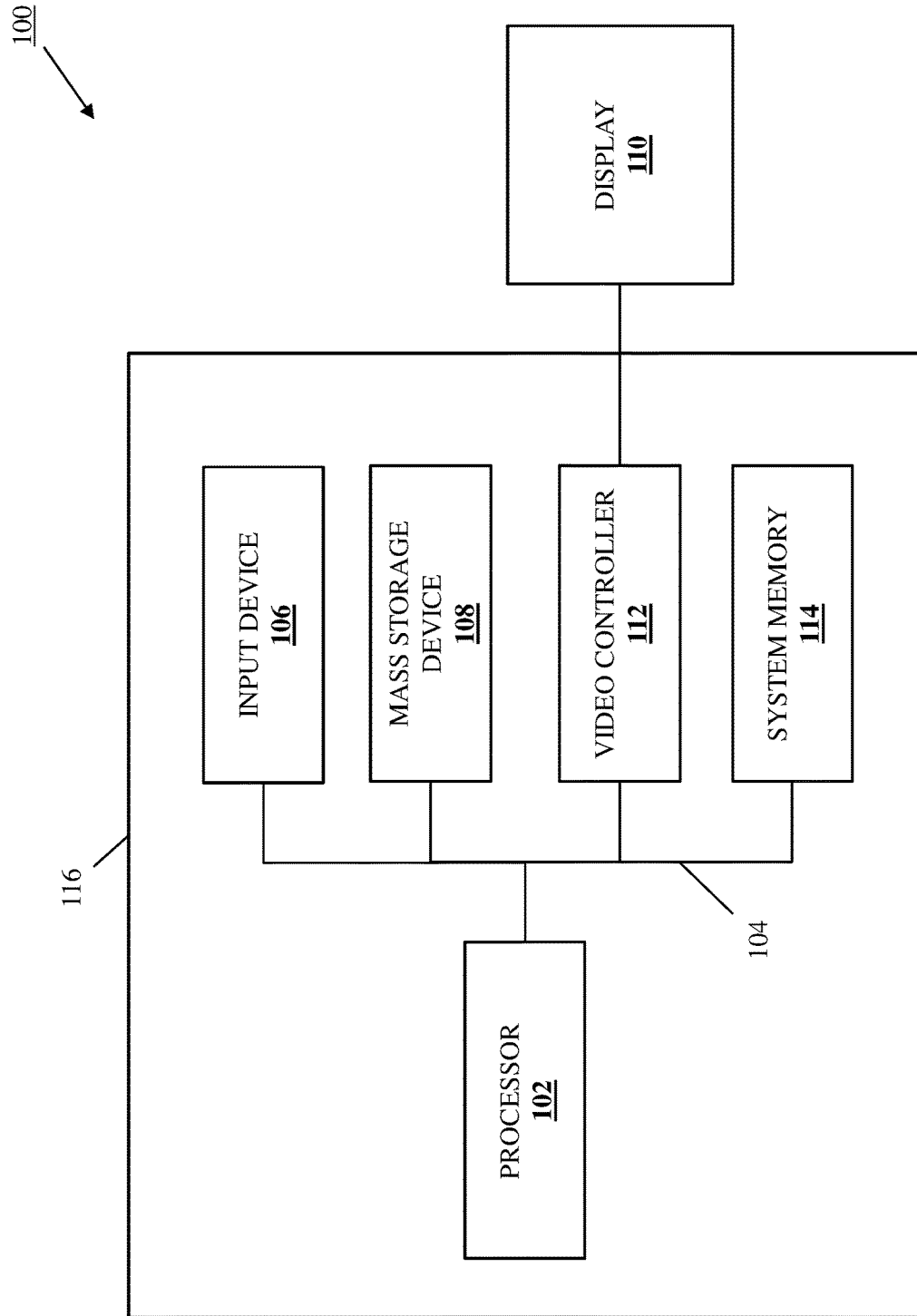
FIG. 1 is a schematic view illustrating an embodiment of an Information Handling System (IHS).

In one embodiment, IHS 100, FIG. 1, includes a processor 102, which is connected to a bus 104. Bus 104 serves as a connection between processor 102 and other components of IHS 100. An input device 106 is coupled to processor 102 to provide input to processor 102. Examples of input devices may include keyboards, touchscreens, pointing devices such as mouses, trackballs, and trackpads, and/or a variety of other input devices known in the art. Programs and data are stored on a mass storage device 108, which is coupled to processor 102. Examples of mass storage devices may include hard discs, optical disks, magneto-optical discs, solid-state storage devices, and/or a variety of other mass storage devices known in the art. IHS 100 further includes a display 110, which is coupled to processor 102 by a video controller 112. A system memory 114 is coupled to processor 102 to provide the processor with fast storage to facilitate execution of computer programs by processor 102. Examples of system memory may include random access memory (RAM) devices such as dynamic RAM (DRAM), synchronous DRAM (SDRAM), solid state memory devices, and/or a variety of other memory devices known in the art. In an embodiment, a chassis 116 houses some or all of the components of IHS 100. It should be understood that other buses and intermediate circuits can be deployed between the components described above and processor 102 to facilitate interconnection between the components and the processor 102.

Figure 2:
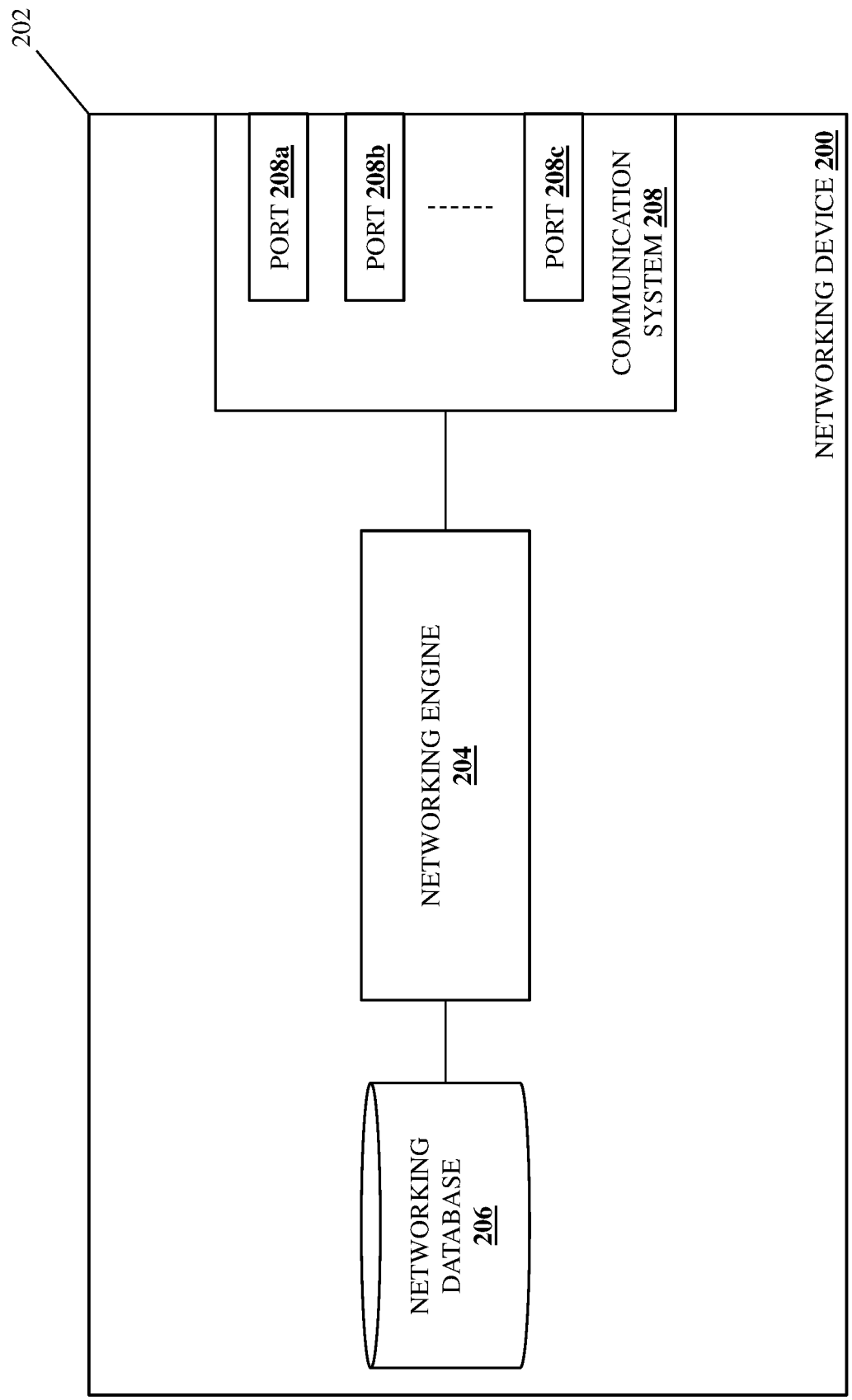
FIG. 2 is a schematic view illustrating an embodiment of a networking device.

Referring now to FIG. 2, an embodiment of a networking device 200 is illustrated. In an embodiment, the networking device 200 may be provided by the IHS 100 discussed above with reference to FIG. 1, and/or may include some or all of the components of the IHS 100, and in specific examples, may be provided by a switch device, a router device, and/or other networking devices known in the art. However, while illustrated and discussed as being provided by a networking device, one of skill in the art in possession of the present disclosure will appreciate that the functionality of the networking device 200 discussed below may be provided by other devices that are configured to operate similarly as the networking device 200 discussed below. In the illustrated embodiment, the networking device 200 includes a chassis 202 that houses the components of the networking device 200, only some of which are illustrated and discussed below. For example, the chassis 202 may house a processing system (not illustrated, but which may include the processor 102 discussed above with reference to FIG. 1) and a memory system (not illustrated, but which may include the memory 114 discussed above with reference to FIG. 1) that is coupled to the processing system and that includes instructions that, when executed by the processing system, cause the processing system to provide a networking engine 204 that is configured to perform the functionality of the networking engine and/or networking devices discussed below.

The chassis 202 may also house a storage system (not illustrated, but which may include the storage device 108 discussed above with reference to FIG. 1) that is coupled to the networking engine 204 (e.g., via a coupling between the storage system and the processing system) and that includes a networking database 206 that is configured to store any of the information utilized by the networking engine 204 discussed below. The chassis 202 may also house a communication system 208 that is coupled to the networking engine 204 (e.g., via a coupling between the communication system and the processing system) and that may be provided by a Network Interface Controller (NIC) and/or any of a variety of other networking communication components that would be apparent to one of skill in the art in possession of the present disclosure. In the illustrated example, the communication system 208 includes a plurality of transceiver device ports 208a, 208b and up to 208c that are configured to connect transceiver devices to the networking engine 204. However, while a specific networking device 200 has been illustrated and described, one of skill in the art in possession of the present disclosure will appreciate that networking devices (and other devices utilizing the transceiver devices of the present disclosure) may include different components and/or component configurations while remaining within the scope of the present disclosure as well.

Figure 3A:
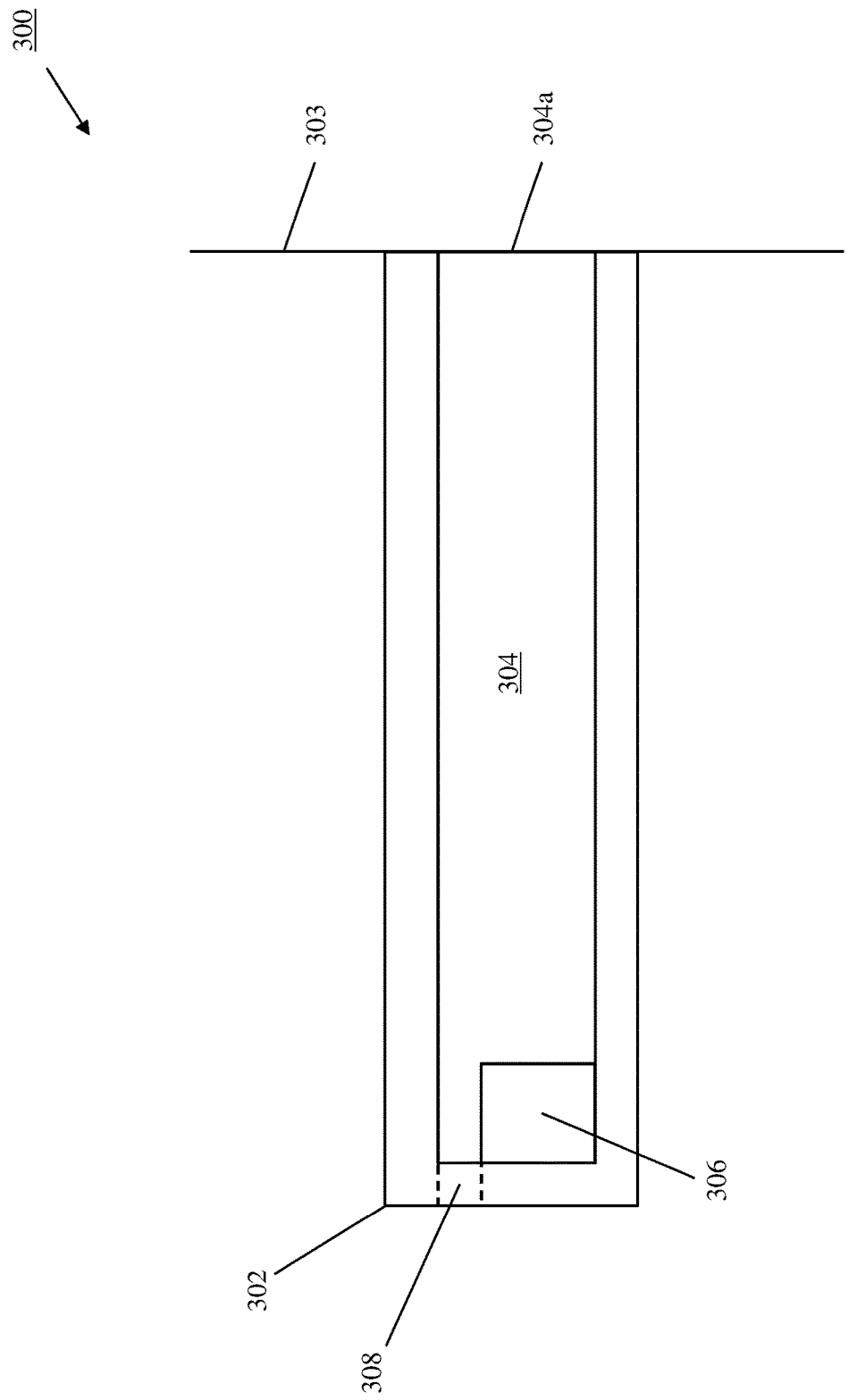
FIG. 3A is a schematic view illustrating an embodiment of a transceiver device port that may be included in the networking device of FIG. 2.

Referring now to FIG. 3A, an embodiment of a transceiver device port 300 is illustrated that may provide any of the transceiver device port(s) 208a, 208b and up to 208c discussed above with reference to FIG. 2. In the illustrated embodiment, the transceiver device port 300 includes a transceiver device port chassis 302 which is accessible on an outer surface 303 of a chassis that may be provided by the chassis 202 of the networking device 200 discussed above with reference to FIG. 2. The transceiver device port chassis 302 defines a transceiver device port housing 304 (which may extend into the chassis 202 of the networking device from the outer surface 303) and includes a transceiver device port entrance 304a that is located substantially co-planer with the outer surface 303. The transceiver device port chassis 302 may house the components of the transceiver device port 300, only some of which are illustrated and described below. For example, the transceiver device port chassis 302 may house a transceiver device port connector 306 that is located opposite the transceiver device port housing 304 from the transceiver device port entrance 304a. The transceiver device port chassis 302 may also include a transceiver device port air channel 308 that is located opposite the transceiver device port housing 304 from the transceiver device port entrance 304 and adjacent the transceiver device port connector 306.

Figure 3B:
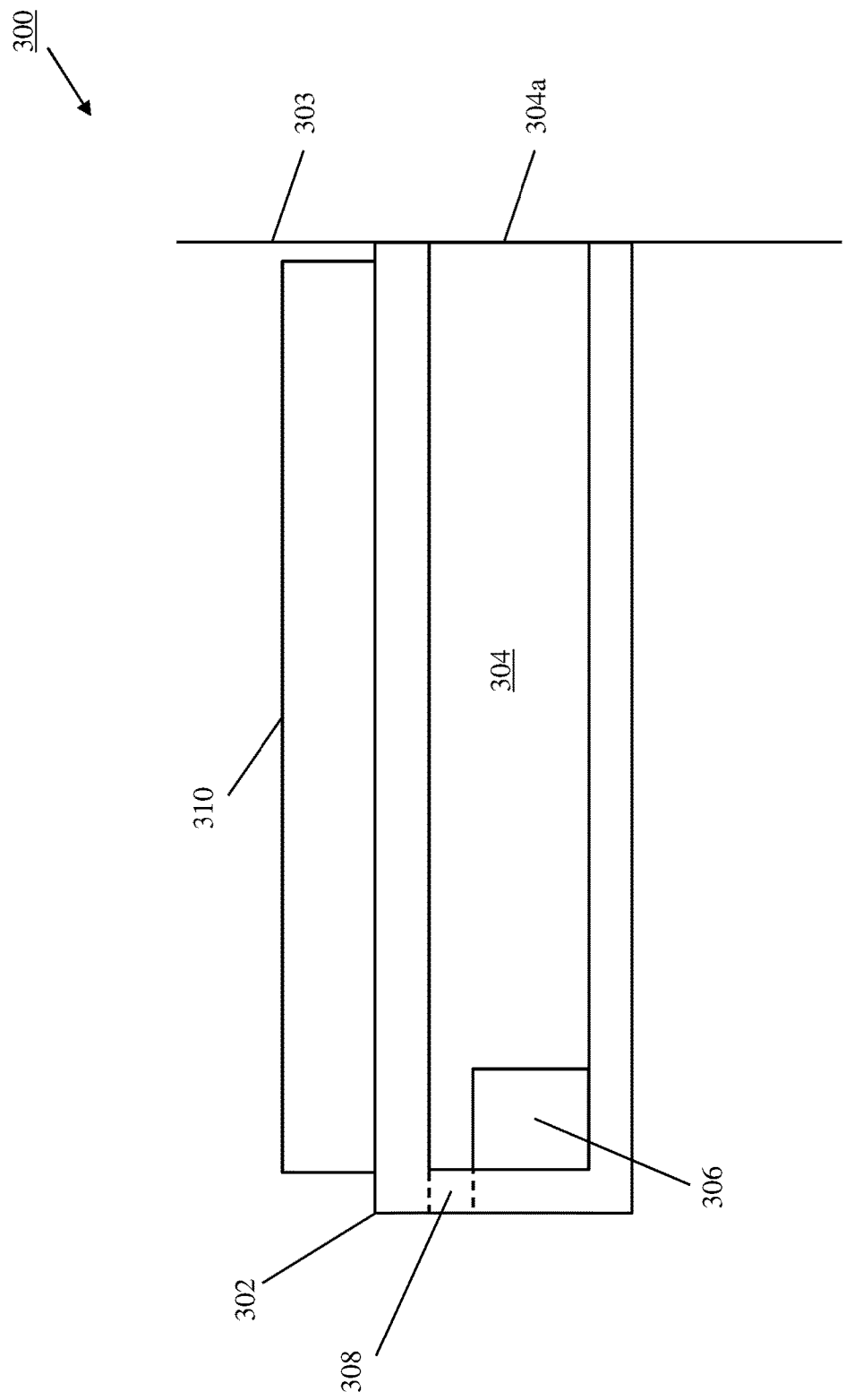
FIG. 3B is a schematic view illustrating an embodiment of a transceiver device port that may be included in the networking device of FIG. 2.

Referring now to FIG. 3B, in some embodiments, the transceiver device port 300 may include a heat dissipation device 310 that engages a top surface of the transceiver device port chassis 302. For example, the heat dissipation device 310 may be provided by a heat sink that is mounted and thermally coupled (e.g., via a thermal paste or other thermal transfer material/component) to the transceiver device port chassis 302 in a manner that is configured to allow heat generated by a transceiver device located in the transceiver device port housing 304 to be transferred via the transceiver device port chassis 302 to the heat sink. However, while a specific example of the heat dissipation device 310 has been illustrated and described, one of skill in the art in possession of the present disclosure will appreciate how other heat dissipation devices will fall within the scope of the present disclosure.

Figure 4A:
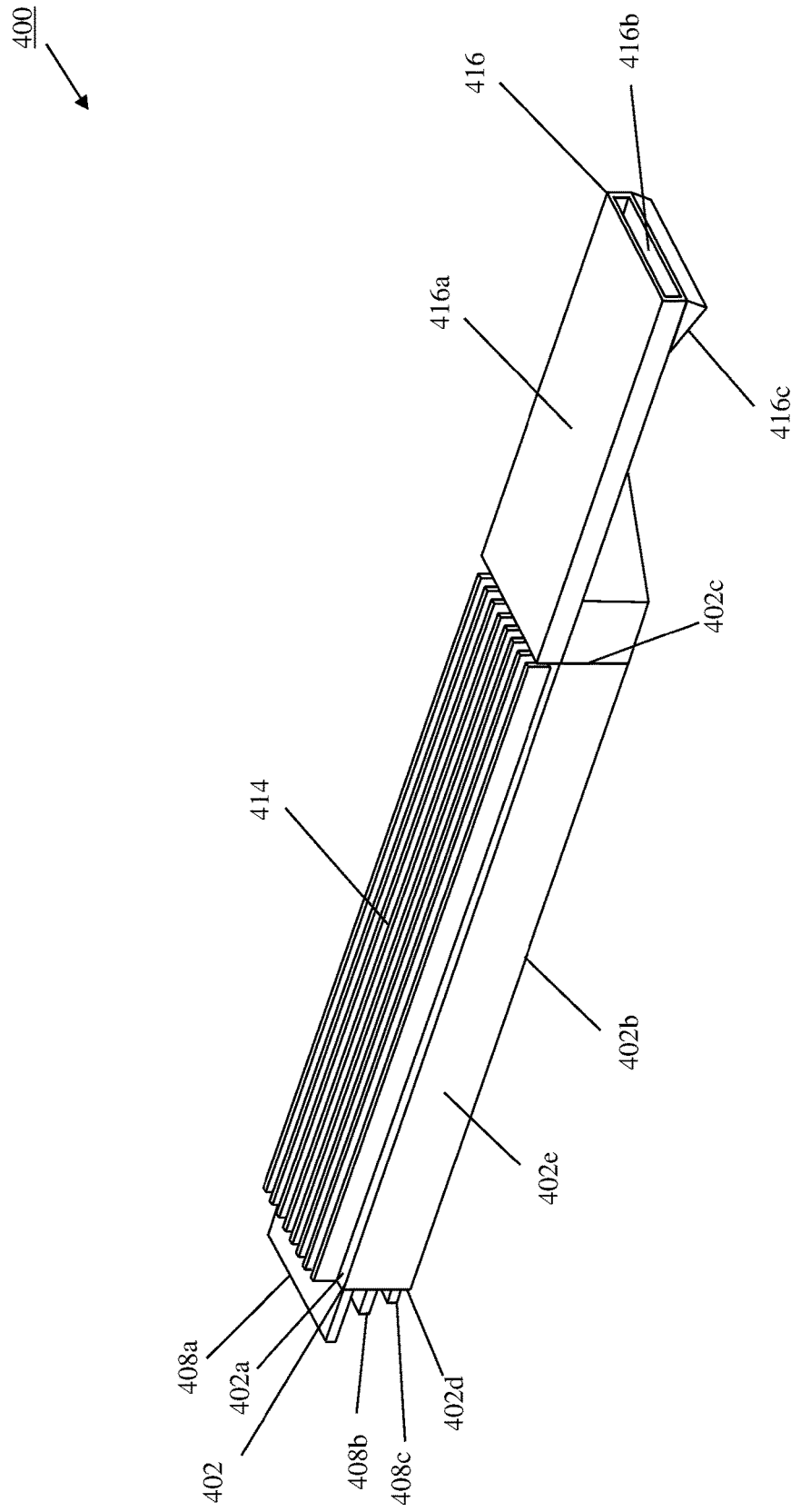
FIG. 4A is a perspective view illustrating an embodiment of a transceiver device that may include the transceiver handle heat dissipation airflow channeling system of the present disclosure.
Figure 4B:
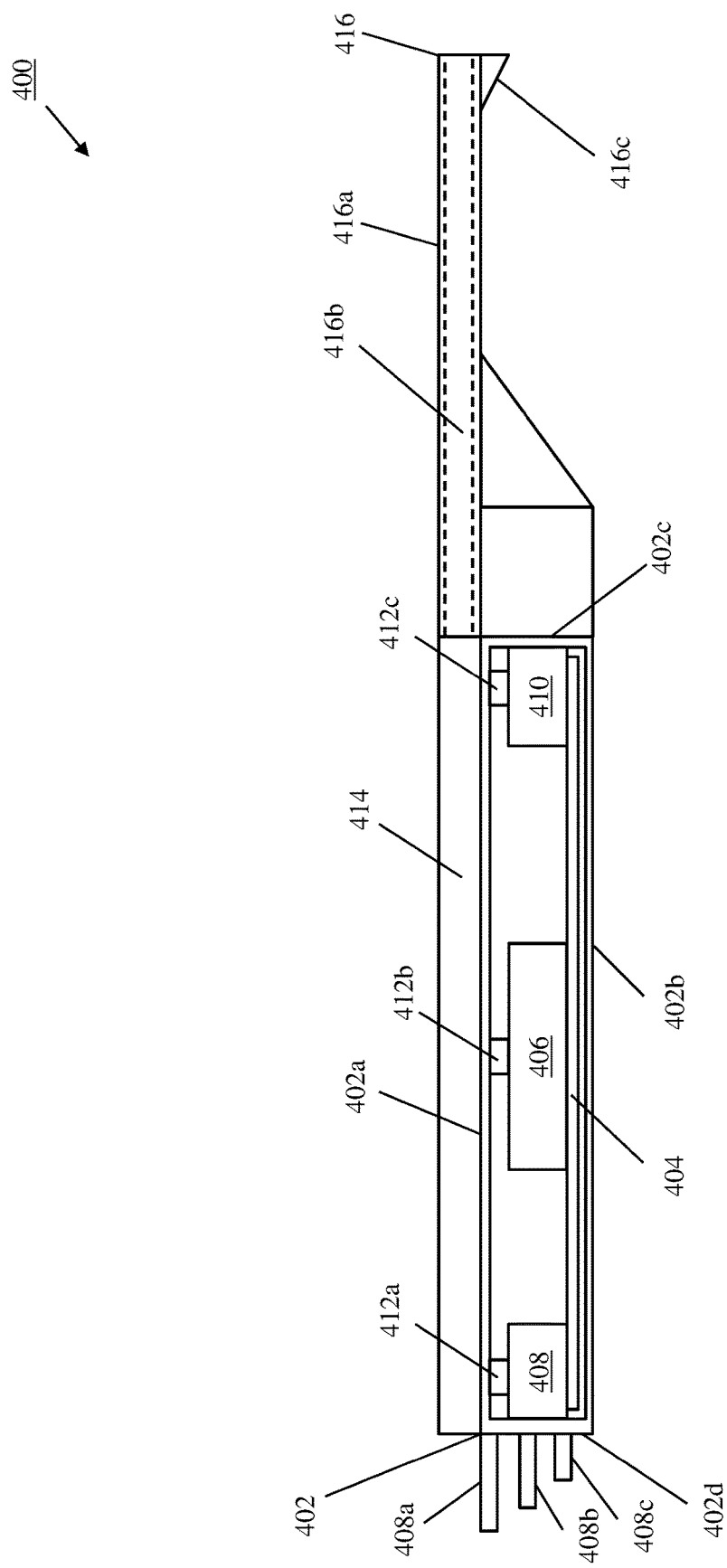
FIG. 4B is a side view illustrating an embodiment of the transceiver device of FIG. 4A.
Figure 4C:
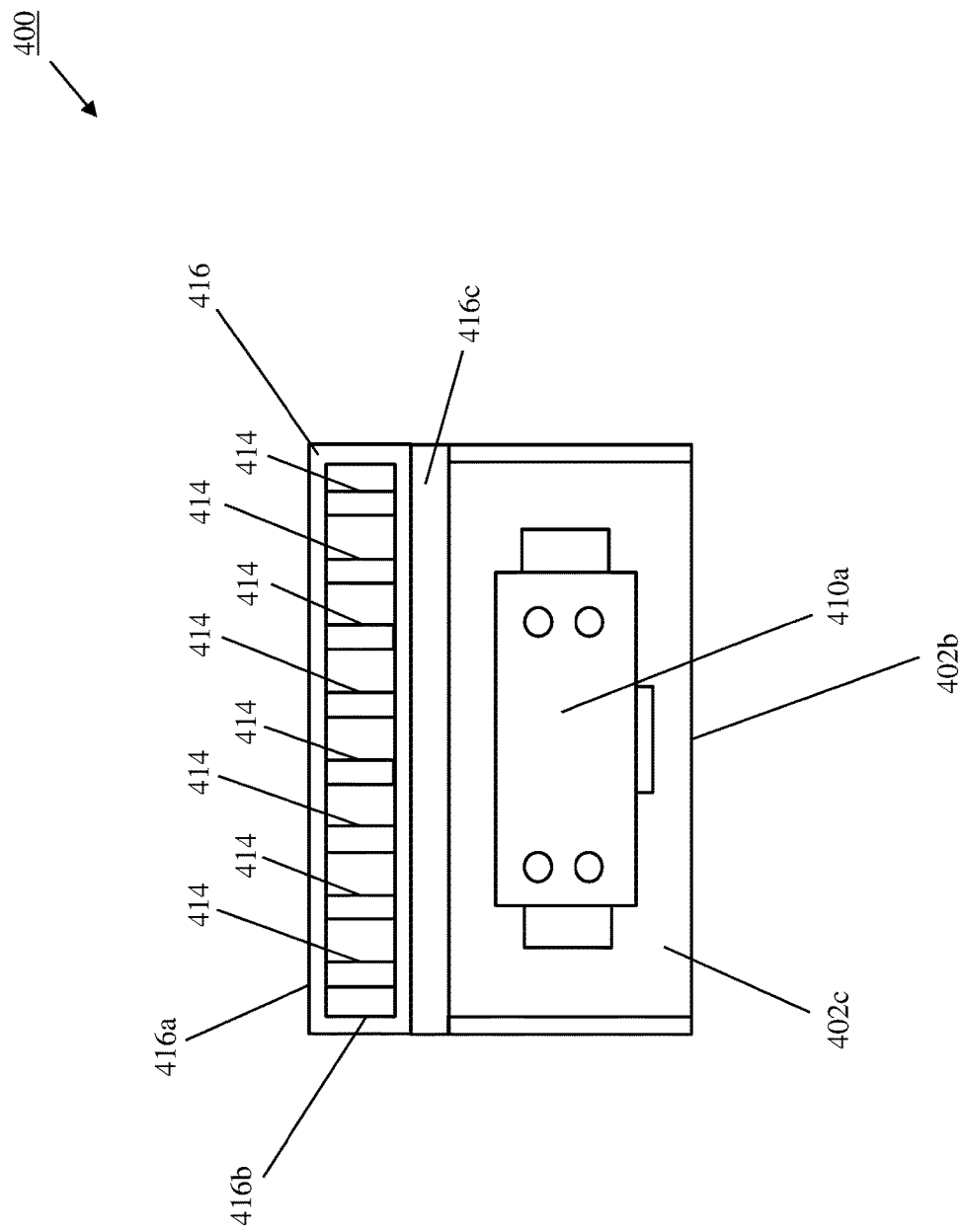
FIG. 4C is a front view illustrating an embodiment of the transceiver device of FIGS. 4A and 4B.

Referring to FIGS. 4A, 4B, and 4C, an embodiment of a transceiver device 400 is illustrated that that includes an integrated heat dissipation device, and that may be used with the networking device 200 and the port(s) 208a, 208b and up to 208c discussed above with reference to FIG. 2. In an embodiment, the transceiver device 400 may be provided by the IHS 100 discussed above with reference to FIG. 1 and/or may include some of all of the components of the IHS 100, and in specific examples may be provided by a relatively high-speed (e.g. 400G, 800G, etc.) Quad Small Form-Factor Pluggable Dual-Density (QSFP-DD) optical transceiver device, although other types of transceiver devices will fall within the scope of the present disclosure as well. In the illustrated embodiment, the transceiver device 400 includes a transceiver device base 402 having a top surface 402a, a bottom surface 402b that is located opposite the transceiver base 402 from the top surface 402a, a front surface 402c that extends between the top surface 402a and the bottom surface 402b, a rear surface 402d that is located opposite the transceiver base 402 from the front surface 402c and that extends between the top surface 402a and the bottom surface 402b, and a side surface 402e that is one of a pair of opposing side surfaces (only one of which is visible in FIG. 4A) that are located opposite the transceiver base 402 from each other and that extend between the top surface 402a, the bottom surface 402b, the front surface 402c, and the rear surface 402d.

As can be seen in FIG. 4B, the transceiver device base 402 may house the components of the transceiver device 400, only some of which are illustrated and described below. For example, the transceiver device base 402 may house a circuit board 404 that may be mounted on the transceiver device base 402, and a transceiver device processing system 406 that is coupled to the circuit board 404, and one of skill in the art in possession of the present disclosure will appreciate how the circuit board 404 and transceiver device processing system 406 may be provided by a variety of transceiver device components known in the art. In the examples provided below, a transceiver device electrical connector 408 is coupled to the transceiver device processing system 406 via the circuit board 404, and a plurality of transceiver device electrical connection elements 408a, 408b and 408c extend from the transceiver device electrical connector 408 and from the rear surface 402d of the transceiver base 402. For example, the transceiver device electrical connection elements 408a-408c may be configured to connect the transceiver device 400 to the transceiver device port connector 306 included in the transceiver device port chassis 302 discussed above in order to enable the transmission of data between the transceiver device 400 and the networking device 200. In the examples provided below, a transceiver device optical connector 410 is also coupled to the transceiver device processing system 406 via the circuit board 404, and may include a transceiver device optical connection element 410a (illustrated in FIG. 4C) that is configured to connect to optical connectors on the cables discussed below.

As illustrated, a respective heat transfer element 412a, 412b, and 412c may be provided between the transceiver device base 402 and each of the transceiver processing system 406, the transceiver device electrical connector 408, and the transceiver device optical connector 410, respectively. For example, the heat transfer elements 412a-412c may be provided by heat spreaders, thermal paste, and/or other heat transfer elements that are configured to transmit heat generated by the respective component to which they are connected to the transceiver device base 402. A heat dissipation device 414 extends from the top surface 402a of the transceiver device base 402 and is configured to receive heat generated by the components housed in the transceiver device 402, distribute that heat across the heat dissipation device 414, and dissipate that heat. As discussed above, the heat dissipation device 414 may be integrated with the transceiver device base 402 (e.g., as an integrated heat sink), but embodiments in which the heat dissipation device 414 is connected to (and may be disconnected from) the transceiver device base 402 will fall within the scope of the present disclosure as well. However, while specific a heat dissipation device has been described, one of skill in the art in possession of the present disclosure will appreciate how other heat dissipation devices will fall within the scope of the present disclosure as well.

As illustrated, the transceiver device 400 may also include a transceiver device handle 416 that extends from the front surface 402c of the transceiver device base 402 (and which may be provided by a flexible material such as SANTOPRENE® materials available from the MONSANTO® company of Creve Coeur, Missouri, United States; SABRIC® materials available the SABRIC® company of Riyadh, Saudi Arabia; materials available from the DUPONT® company of Wilmington, Delaware, United, States; other plastic materials, other rubber materials, other flexible materials, and/or any other materials that one of skill in the art would recognize as capable of providing the transceiver device handle 416 discussed below). As can be seen, the transceiver device handle 416 includes a transceiver device handle base 416a that is positioned adjacent the heat dissipation device 414. In an embodiment, the transceiver device handle base 416a may be dimensioned such that it does not extend beyond the height of the heat dissipation device 414 in order to, for example, prevent the transceiver device handle base 416a from blocking airflow to the networking device to which it may be connected. In a specific example, the dimensions of the transceiver device base 402 may be approximately 60 mm in length (e.g., as measured between the heat dissipation device 414 and the distal end of the transceiver device handle 416), 18 mm in width (e.g., as measured between the side surfaces of the transceiver device base 402), and 2 mm in height (e.g., as measured from the top surface 402a of the transceiver device base 402 to the top of the heat dissipation device 414).

The transceiver device base 402 defines a transceiver device handle airflow channel 416b that includes a transceiver device handle airflow channel entrance that is defined by the transceiver device handle 416 and that is located opposite the transceiver device handle airflow channel 416b from a transceiver device handle airflow channel exit that is located immediately adjacent the heat dissipation device 414. A transceiver device handle grip tab 416c is included on the transceiver device handle base 416a and located adjacent the transceiver device handle airflow channel entrance of the transceiver device airflow channel 416b. However, while a specific example of an optical/electrical transceiver device has been illustrated and described, one of skill in the art in possession of the present disclosure will appreciate how other devices may utilize the transceiver handle heat dissipation airflow channeling system of the present disclosure while remaining within its scope.

Figure 5A:
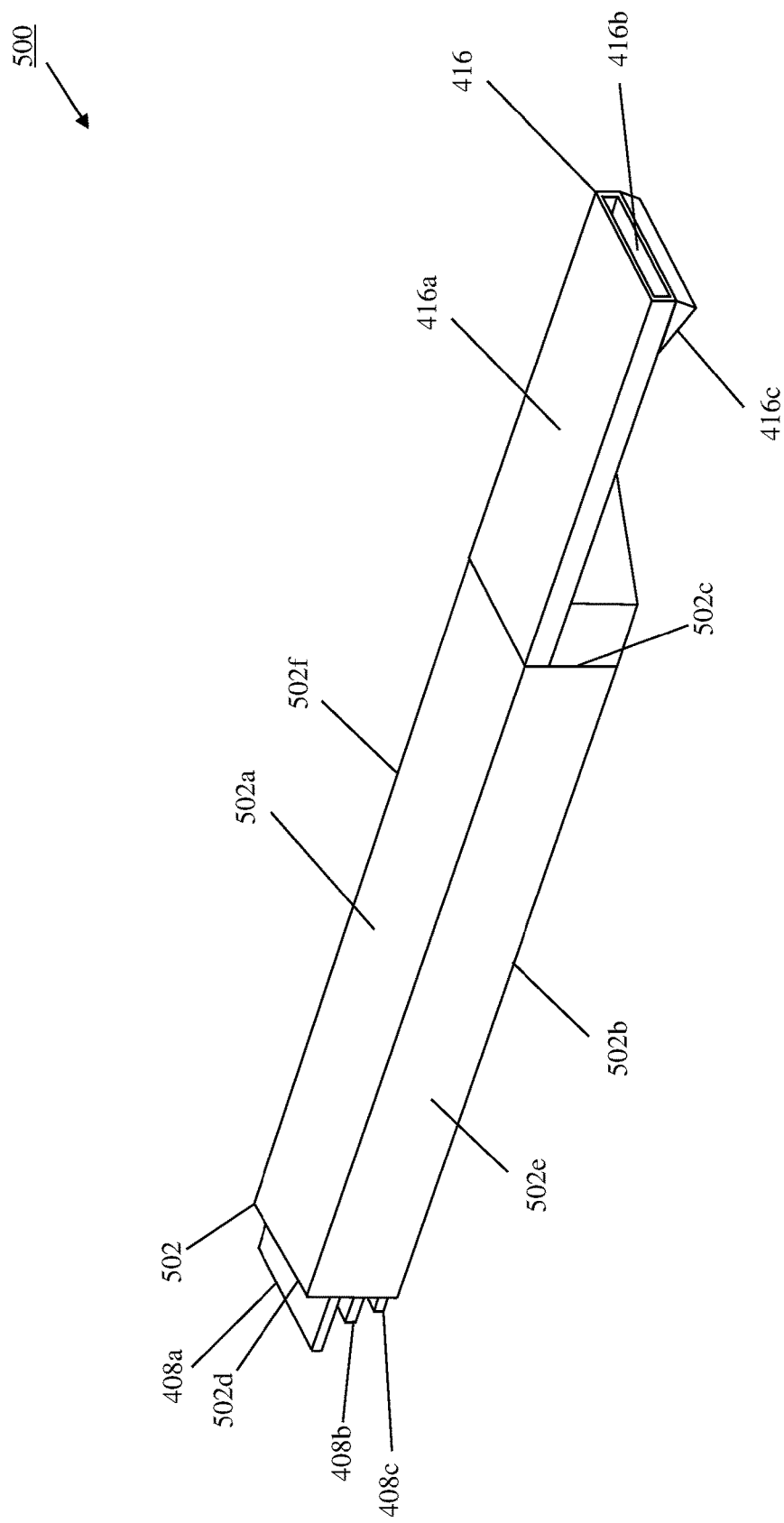
FIG. 5A is a perspective view illustrating an embodiment of a transceiver device that may include the transceiver handle heat dissipation airflow channeling system of the present disclosure.
Figure 5B:
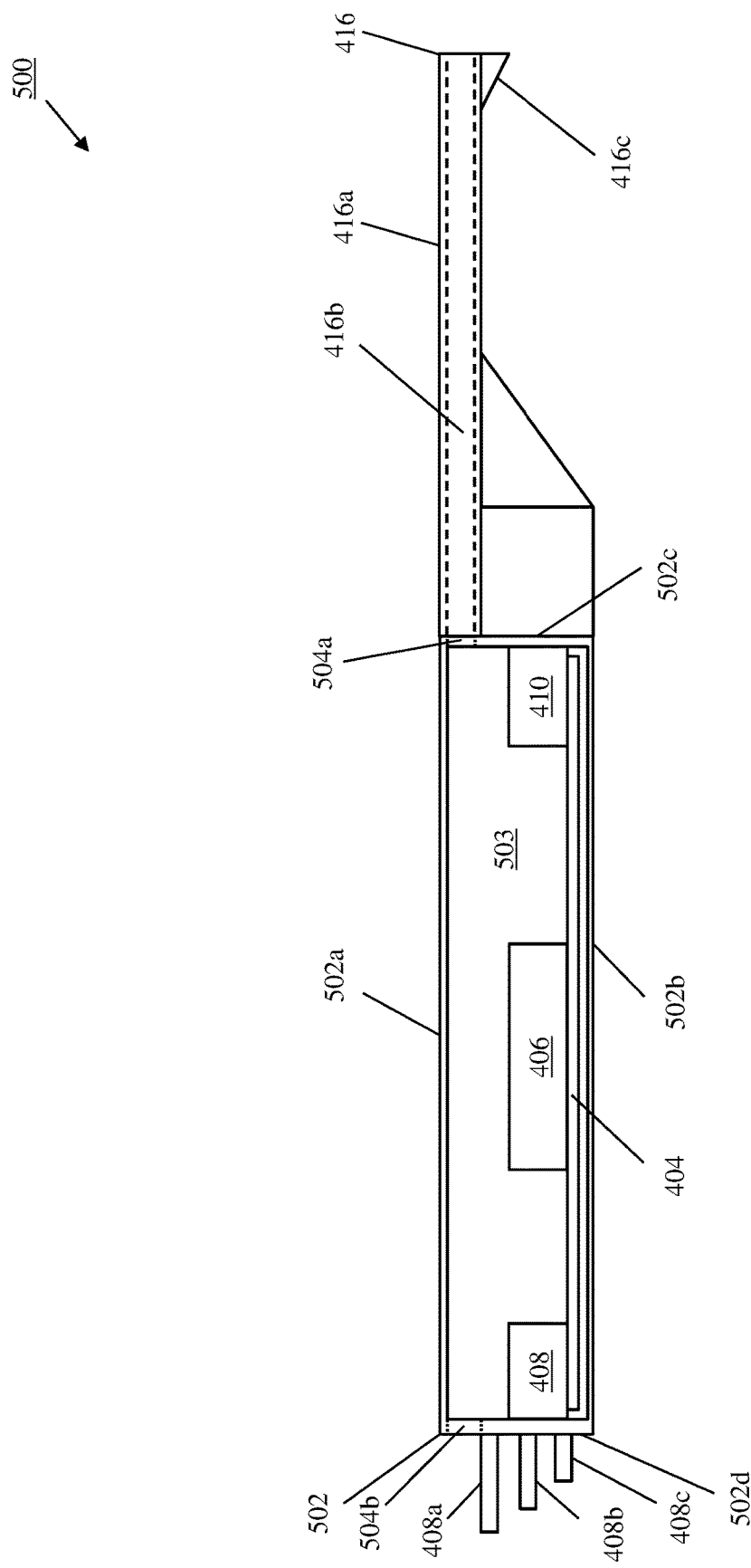
FIG. 5B is a side view illustrating an embodiment of the transceiver device of FIG. 5A.
Figure 5C:
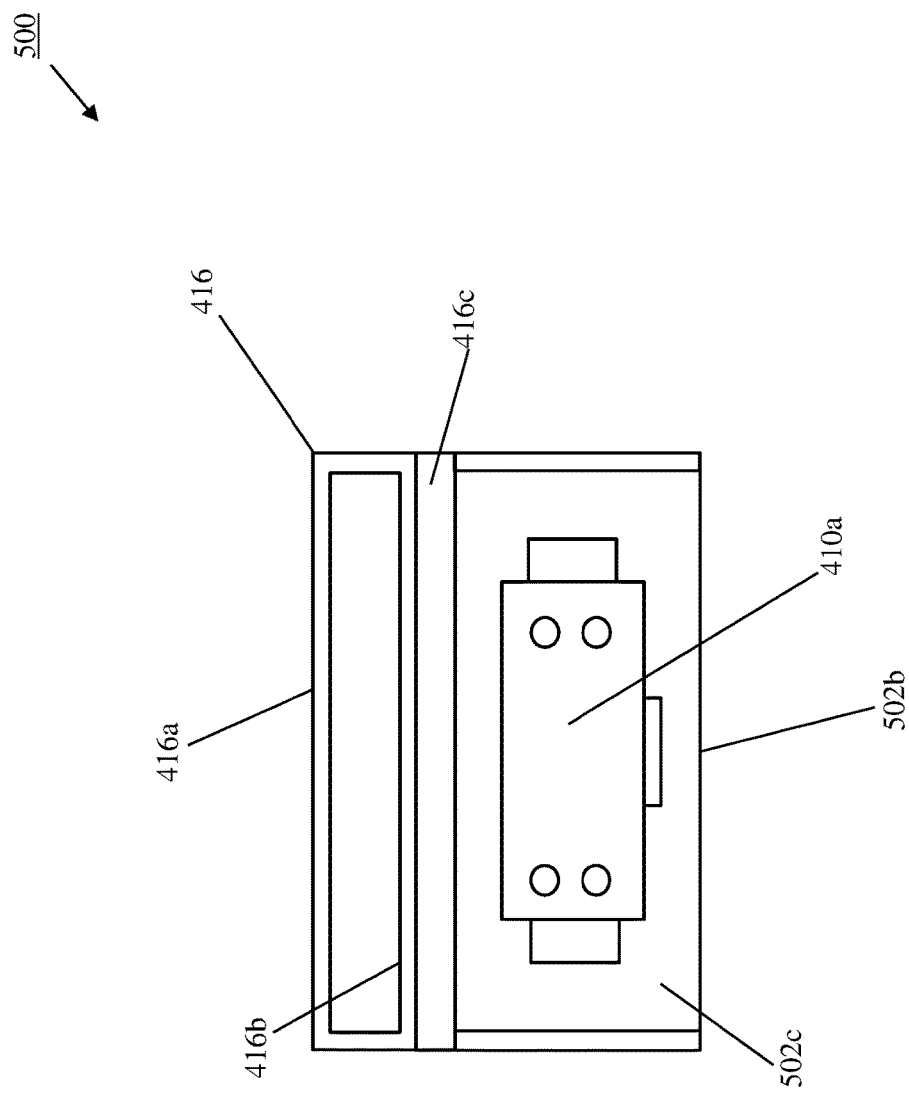
FIG. 5C is a front view illustrating an embodiment of the transceiver device of FIGS. 5A and 5B.

Referring to FIGS. 5A, 5B, and 5C, an embodiment of a transceiver device 500 is illustrated that is similar to the transceiver device 400 discussed above with reference to FIGS. 4A-4C, and thus similar components are provided with similar element numbers. As will be appreciated by one of skill in the art in possession of the present disclosure, the transceiver device 500 does not utilize a heat dissipation device (e.g., like that described in FIGS. 4A, 4B, and 4C), and thus does not include heat transfer elements like the heat transfer elements 412a, 412b, and 412c discussed above with reference to FIGS. 4A-4C. Similarly as discussed above, the transceiver device 500 may be used with the networking device 200 and the port(s) 208a, 208b and up to 208c discussed above with reference to FIG. 2. In an embodiment, the transceiver device 500 may be provided by the IHS 100 discussed above with reference to FIG. 1 and/or may include some of all of the components of the IHS 100, and in specific examples may be provided by a relatively high-speed (e.g. 400G, 800G, etc.) Quad Small Form-Factor Pluggable Dual-Density (QSFP-DD) optical transceiver device, although other types of transceiver devices will fall within the scope of the present disclosure as well.

In the illustrated embodiment, the transceiver device 500 includes a transceiver device base 502 having a top surface 502a, a bottom surface 502b that is located opposite the transceiver base 502 from the top surface 502a, a front surface 502c that extends between the top surface 502a and the bottom surface 502b, a rear surface 502d that is located opposite the transceiver base 502 from the front surface 502c and that extends between the top surface 502a and the bottom surface 502b, and a pair of opposing side surfaces 502e and 502f that are located opposite the transceiver base 502 from each other and that extend between the top surface 502a, the bottom surface 502b, the front surface 502c, and the rear surface 502d. As such, the transceiver device base 502 defines a component housing 503 (illustrated in FIG. 5B) between the top surface 502a, the bottom surface 502b, the front surface 502c, the rear surface 502d, and the side surfaces 502e and 502f.

As can be seen in FIG. 5B, the component housing 503 defined by the transceiver device base 502 may house the components of the transceiver device 500 that are similar to the components of the transceiver device 400, and only some of which are illustrated and described below. As such, the component housing 503 defined by the transceiver device base 502 may house the circuit board 404 that may be mounted on the transceiver device base 502, and the transceiver device processing system 406 that is coupled to the circuit board 404, and one of skill in the art in possession of the present disclosure will appreciate how the circuit board 404 and transceiver device processing system 406 may be provided by a variety of transceiver device components known in the art. In the examples provided below, the transceiver device electrical connector 408 is coupled to the transceiver device processing system 406 via the circuit board 404, and the plurality of transceiver device electrical connection elements 408a, 408b and 408c extend from the transceiver device electrical connector 408 and from the rear surface 502d of the transceiver base 502, with the transceiver device electrical connection elements 408a-408c configured to connect the transceiver device 500 to the transceiver device port connector 306 included in the transceiver device port chassis 302 discussed above in order to enable the transmission of data between the transceiver device 500 and the networking device 200.

Similarly as described above, the transceiver device optical connector 410 is also coupled to the transceiver device processing system 406 via the circuit board 404, and may include a transceiver device optical connection element 410a (illustrated in FIG. 5C) that is configured to connect to optical connectors on the cables discussed below. As illustrated, the transceiver device base 502 may also define a transceiver device base air entrance 504a that is located on the front surface 502c of the transceiver device base 502 and adjacent the top surface 502a, and a transceiver device base air exit 504b that is located on the rear surface 502d of the transceiver device base 502 and adjacent the top surface 502a, and one of skill in the art in possession of the present disclosure will recognize how the transceiver device base air entrance 504a and the transceiver device base air exit 504b are configured to allow airflow to enter and exit the component housing 503 of the transceiver device base 502 to dissipate heat generated by the components included therein.

Similarly as discussed above, the transceiver device 500 may also include the transceiver device handle 416 that extends from the front surface 502c of the transceiver device base 502, and that may be provided by similar materials and with similar dimensions as discussed above. As can be seen, the transceiver device handle 416 includes the transceiver device handle base 416a that defines the transceiver device handle airflow channel 416b along its length, the transceiver device handle airflow channel entrance of the transceiver device handle airflow channel 416b, and the transceiver device handle airflow channel exit that is located opposite the transceiver device handle airflow channel 416b from the transceiver device handle airflow channel entrance. Furthermore, the transceiver device handle airflow channel exit is located immediately adjacent the transceiver device base air entrance 504a. The transceiver device handle grip tab 416c is included on the transceiver device handle base 416a and located adjacent the transceiver device handle airflow channel entrance of the transceiver device airflow channel 416b. However, while a specific example of an optical/electrical transceiver device has been illustrated and described, one of skill in the art in possession of the present disclosure will appreciate how other devices may utilize the transceiver handle heat dissipation airflow channeling system of the present disclosure while remaining within its scope.

Figure 6A:
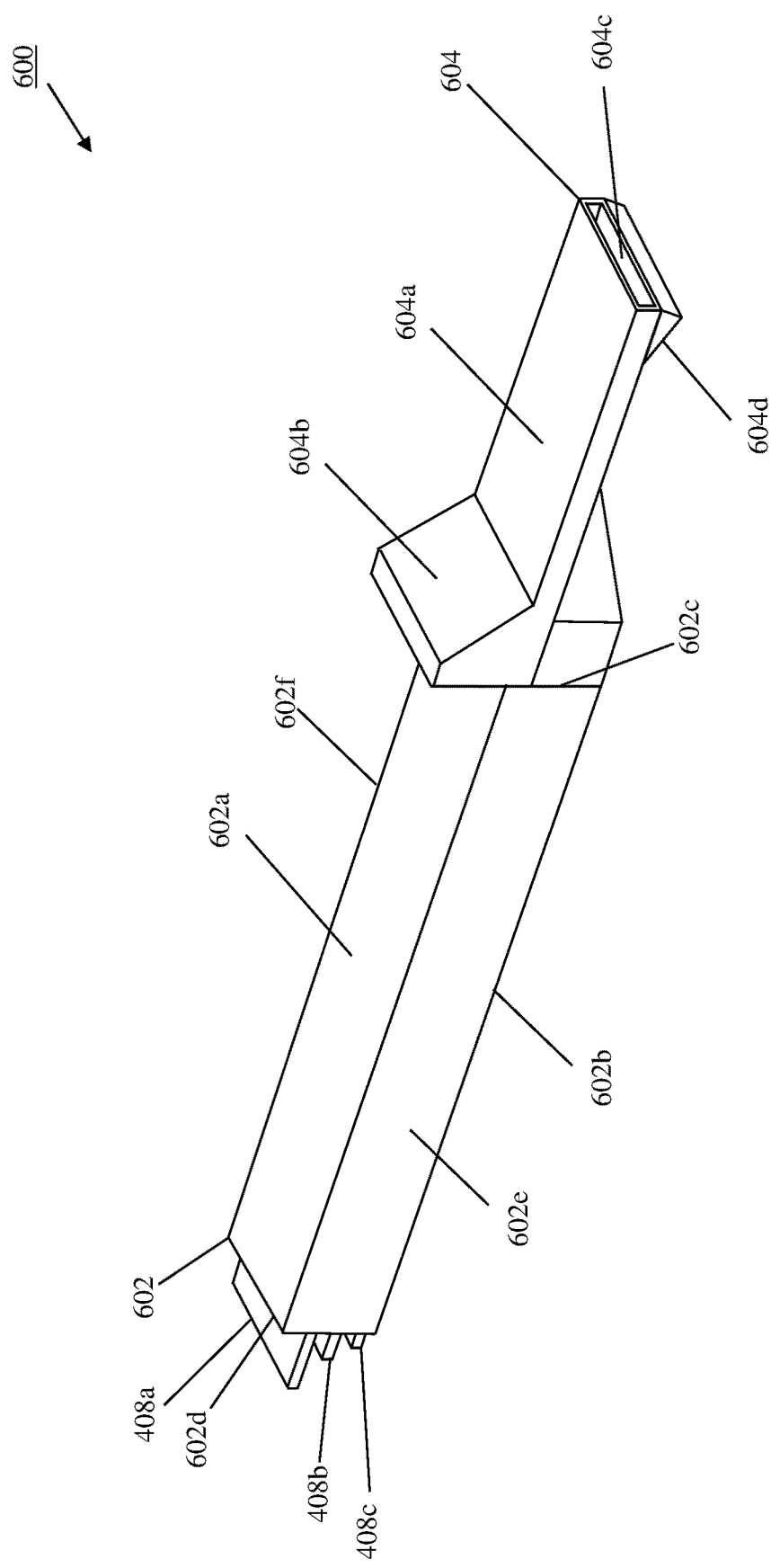
FIG. 6A is a perspective view illustrating an embodiment of a transceiver device that may include the transceiver handle heat dissipation airflow channeling system of the present disclosure.
Figure 6B:
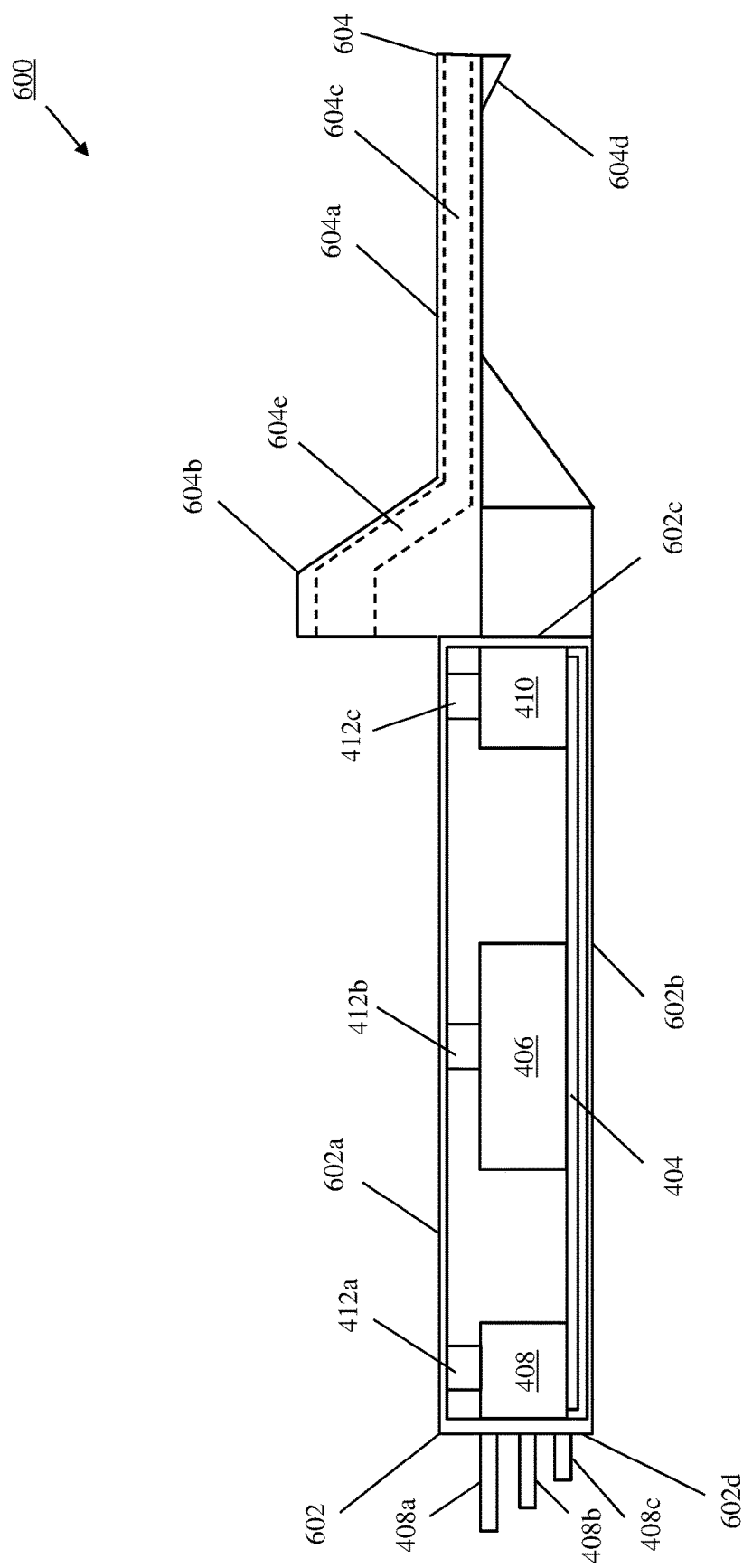
FIG. 6B is a side view illustrating an embodiment of the transceiver device of FIG. 6A.
Figure 6C:
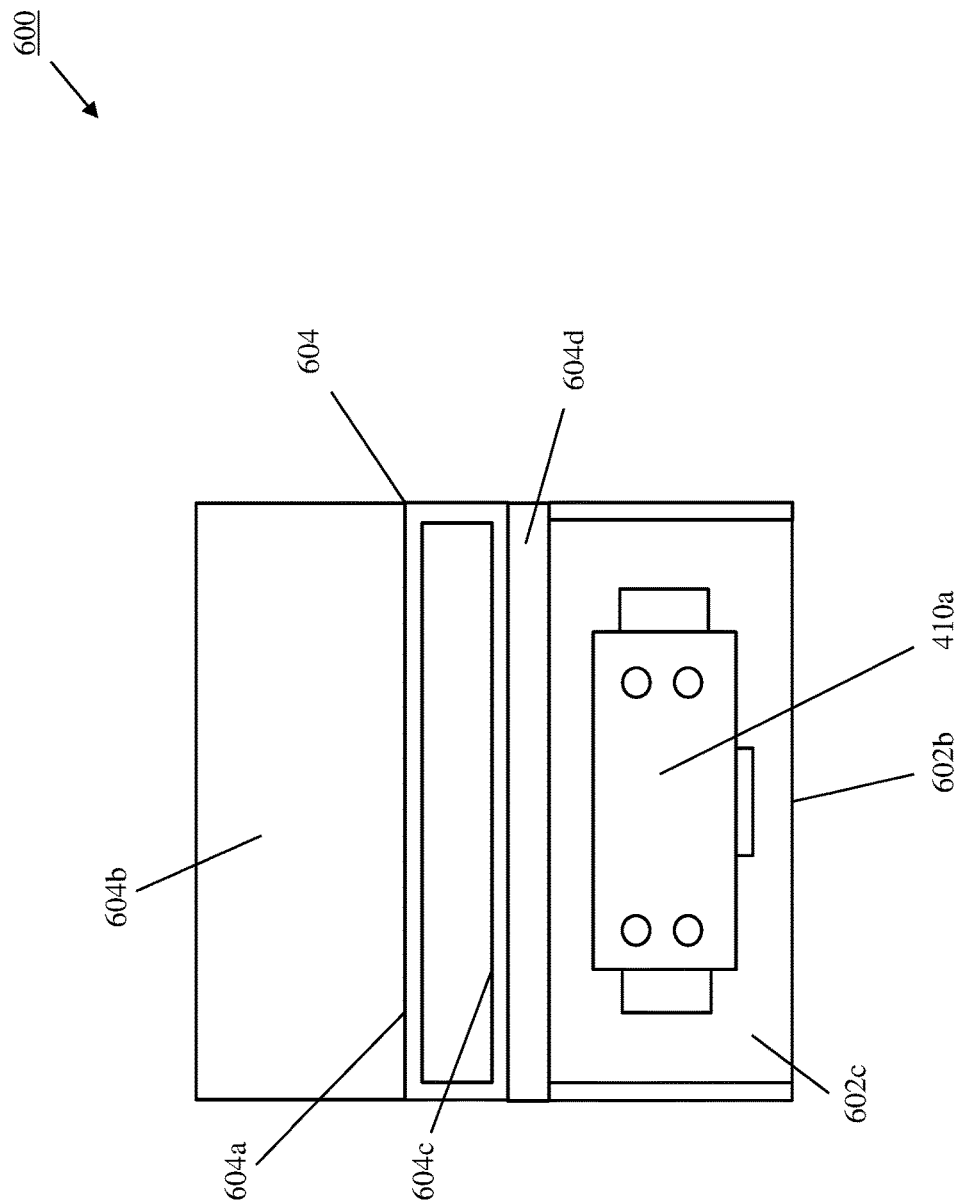
FIG. 6C is a front view illustrating an embodiment of the transceiver device of FIGS. 6A and 6B.

Referring to FIGS. 6A, 6B, and 6C, an embodiment of a transceiver device 600 is illustrated that is similar to the transceiver device 400 discussed above with reference to FIGS. 4A-4C, and thus similar components are provided with similar element numbers. As discussed below, the transceiver device 600 utilizes the heat dissipation device 310 that is coupled to the transceiver device port chassis 302 to which is it connected. Similarly as discussed above, the transceiver device 600 may be used with the networking device 200 and the port(s) 208a. 208b and up to 208c discussed above with reference to FIG. 2. Furthermore, the transceiver device 600 may be provided by the IHS 100 discussed above with reference to FIG. 1 and/or may include some of all of the components of the IHS 100, and in specific examples may be provided by a relatively high-speed (e.g. 400G, 800G, etc.) Quad Small Form-Factor Pluggable Dual-Density (QSFP-DD) optical transceiver device, although other types of transceiver devices will fall within the scope of the present disclosure as well. In the illustrated embodiment, the transceiver device 600 includes a transceiver device base 602 having a top surface 602a, a bottom surface 602b that is located opposite the transceiver base 602 from the top surface 602a, a front surface 602c that extends between the top surface 602a and the bottom surface 602b, a rear surface 602d that is located opposite the transceiver base 602 from the front surface 602c and that extends between the top surface 602a and the bottom surface 602b, and a pair of opposing side surfaces 602e and 602f that are located opposite the transceiver base 602 from each other and that extend between the top surface 602a, the bottom surface 602b, the front surface 602c, and the rear surface 602d.

As can be seen in FIG. 6B, the transceiver device base 602 may house the components of the transceiver device 600 that are similar to the components of the transceiver device 400, only some of which are illustrated and described below. For example, the transceiver device base 602 may house the circuit board 404 that may be mounted on the transceiver device base 602, and the transceiver device processing system 406 that is coupled to the circuit board 404, and one of skill in the art in possession of the present disclosure will appreciate how the circuit board 404 and transceiver device processing system 406 may be provided by a variety of transceiver device components known in the art. In the examples provided below, the transceiver device electrical connector 408 is coupled to the transceiver device processing system 406 via the circuit board 404, and the plurality of transceiver device connection elements 408a, 408b and 408c extend from the transceiver device electrical connector 408 and from the rear surface 602d of the transceiver base 602, with the transceiver device connection elements 408a-408c configured to connect the transceiver device 600 to the transceiver device port connector 306 included in the transceiver device port chassis 302 discussed above in order to enable the transmission of data between the transceiver device 600 and the networking device 200. In the examples provided below, the transceiver device optical connector 410 is also coupled to the transceiver device processing system 406 via the circuit board 404, and may include the transceiver device optical connection element 410a (illustrated in FIG. 6C) that is configured to connect to optical connectors on the cables discussed below.

As illustrated, the respective heat transfer elements 412a, 412b, and 412c may be provided between the transceiver device base 602 and each of the transceiver processing system 406, the transceiver device electrical connector 408, and the transceiver device optical connector 410, respectively. Similarly as discussed above, the heat transfer elements 412a-412c may be provided by heat spreaders, thermal paste, and/or other heat transfer elements that are configured to transmit heat generated by the respective component to which they are connected to the transceiver device base 602. As described in further detail below, the heat transfer elements 412a-412c may transmit heat via the transceiver device base 602 and the transceiver device port chassis 302 to which the transceiver device 600 is connected and to the heat dissipation device 310 mounted to the transceiver device port chassis 302, with the heat dissipation device 310 distributing that heat across the heat dissipation device 310 and dissipating that heat. However, while a specific example of transmitting heat to a heat dissipation device has been described, one of skill in the art in possession of the present disclosure will appreciate how heat may be transmitted to heat dissipation devices in a variety of manners will fall within the scope of the present disclosure as well.

As illustrated, the transceiver device 600 may also include a transceiver device handle 604 that extends from the front surface 602c of the transceiver device base 602, and that may be provided by similar materials and with similar dimensions as discussed above. As can be seen, the transceiver device handle 604 includes a transceiver device handle base 604a and a transceiver device handle airflow redirection element 604b that is positioned adjacent the front surface 602c of the transceiver device base 602. As can be seen, the transceiver device handle 604 defines a transceiver device handle airflow channel along its length that includes a transceiver device handle primary air channel 604c defined by the transceiver device handle base 604a, and a transceiver device handle airflow redirection channel 604e defined by the transceiver device handle airflow redirection element 604b.

As illustrated, the transceiver device handle primary airflow channel 604c includes a transceiver device handle airflow channel entrance that is defined by the transceiver device handle base 604a. Furthermore, the transceiver device handle airflow redirection channel 604e includes a transceiver device handle airflow channel exit that is defined by the transceiver device handle airflow redirection element 604b, with the transceiver device handle airflow channel entrance located opposite the transceiver device handle airflow channel from the transceiver device handle airflow channel exit. A transceiver device handle grip tab 604d is included on the transceiver device handle base 604a and located adjacent the transceiver device handle airflow channel entrance of the transceiver device handle primary airflow channel 604c. However, while a specific example of an optical/electrical transceiver device has been illustrated and described, one of skill in the art in possession of the present disclosure will appreciate how other devices may utilize the transceiver handle heat dissipation airflow channeling system of the present disclosure while remaining within its scope.

Referring now to FIG. 7, an embodiment of a method 700 for dissipating heat generated by a transceiver device by channeling airflow through a transceiver device handle is illustrated. As discussed below, the systems and methods of the present disclosure provide for the channeling of airflow through a transceiver device handle to dissipate heat generated by heat producing component(s) in the transceiver device and, in some embodiments, transferred to a heat dissipation device coupled to the transceiver device. For example, the transceiver handle heat dissipation airflow channeling system of the present disclosure may include a transceiver device having a transceiver device chassis, at least one heat producing component that is housed in the transceiver device chassis, and a transceiver device handle that extends from the transceiver device chassis and that defines an airflow channel along its length. The transceiver device handle receives airflow at an airflow channel entrance defined by the transceiver device handle, directs the airflow through the airflow channel, and dissipates heat generated by the heat producing component(s) using the airflow directed through the airflow channel. For example, the airflow may be directed through the airflow channel and adjacent the heat producing component(s) in the transceiver device chassis, adjacent a heat dissipation device that is integrated with the transceiver device chassis, or adjacent a heat dissipation device that extends from a transceiver device port to which the transceiver device is connected. As described below, the transceiver handle heat dissipation airflow channeling system enhances heat dissipation for transceiver devices relative to conventional transceiver device heat dissipation systems.

Figure 8A:
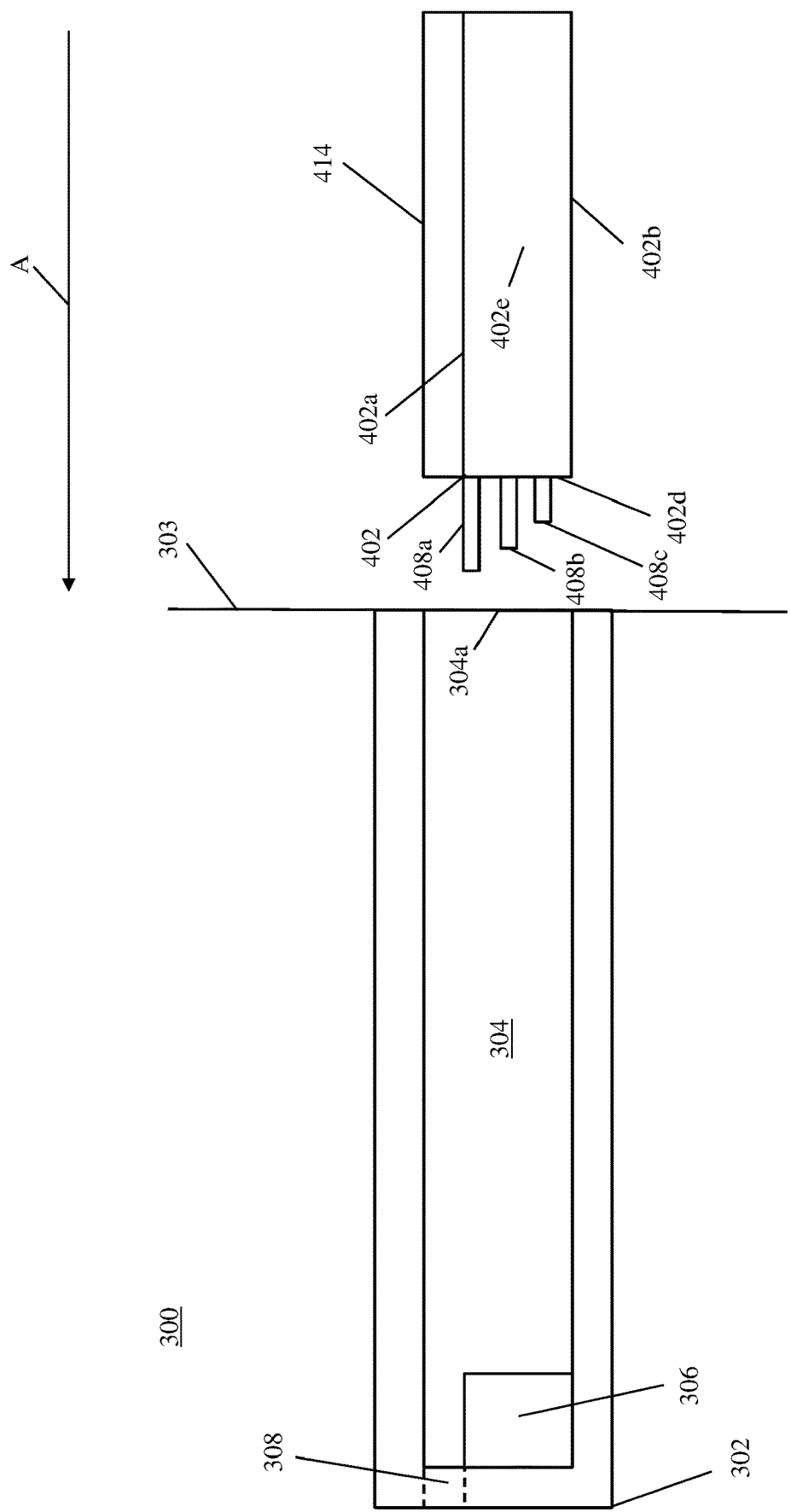
FIG. 8A is a side view illustrating an embodiment of any of the transceiver devices of FIGS. 4A-4C being connected to the transceiver device port of FIG. 3A during the method of FIG. 7.
Figure 8B:
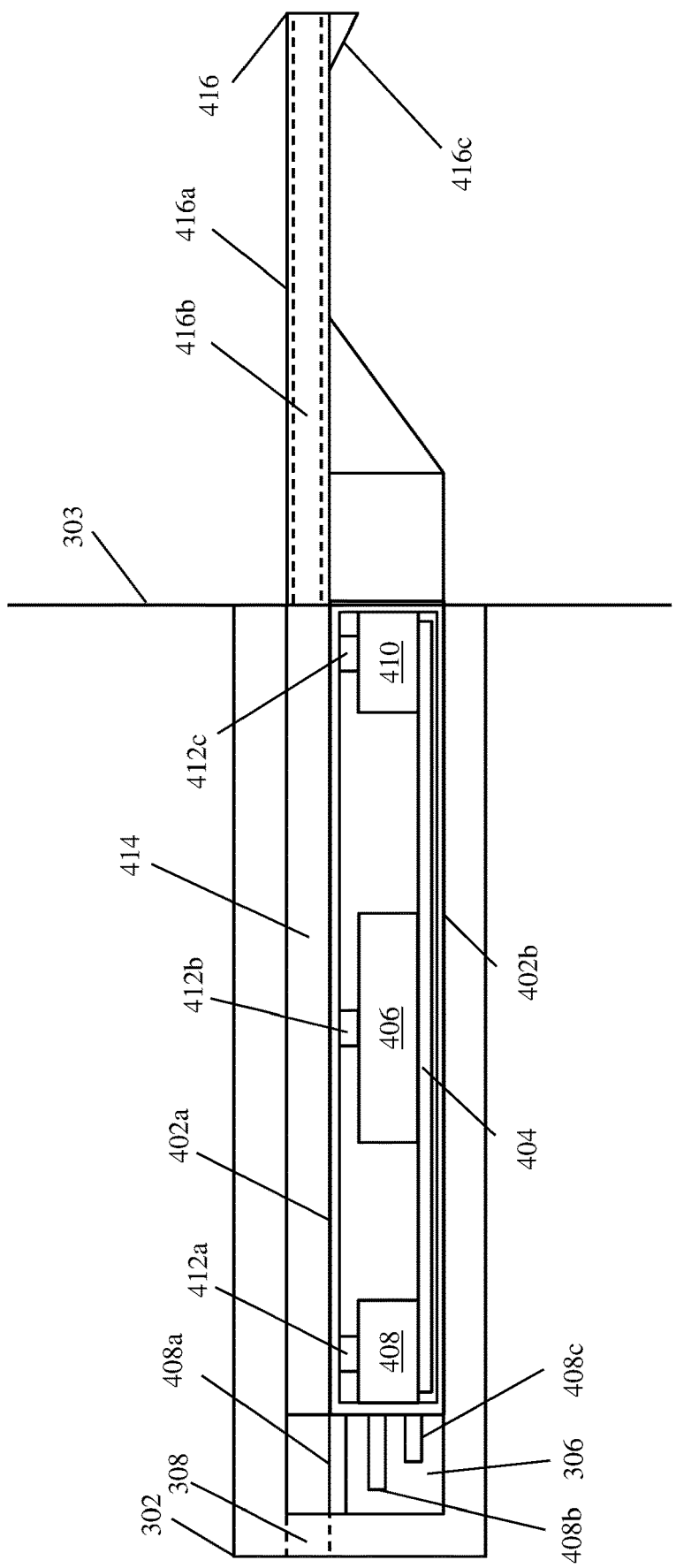
FIG. 8B is a side view illustrating an embodiment of the transceiver device of FIGS. 4A-4C connected to the transceiver device port of FIG. 3A during the method of FIG. 7.

The method 700 begins at block 702 where a transceiver device is connected to a transceiver device port on a networking device. With reference to FIGS. 8A and 8B, in an embodiment of block 702, the transceiver device 400 may be positioned adjacent the transceiver device port 300 such that the rear surface 402d of the transceiver device base 402 is located adjacent to and is aligned with the transceiver device port entrance 304a of the transceiver device port housing 304. As will be appreciated by one of skill in the art in possession of the present disclosure, a user may grasp the transceiver device handle 416 to position the transceiver device 400 adjacent the transceiver device port 300 in the manner illustrated in FIG. 8A in order to connect the transceiver device 400 to the transceiver device port 300.

The transceiver device base 402 on the transceiver device 400 may then be moved in a direction A such that the transceiver device base 402 moves through the transceiver device port entrance 304a and into the transceiver device port housing 304. As can be seen in FIGS. 8A and 8B the movement of the transceiver device 400 in the direction A may cause the transceiver device base 402 on the transceiver device 400 to move through the transceiver device port entrance 304a and into the transceiver device port housing 304 until the plurality of transceiver device electrical connection elements 408a, 408b and 408c connect to the transceiver device port connector 306 included on the transceiver device port chassis 302. As can be seen in FIG. 8B, when the transceiver device 400 is connected to the transceiver device port chassis 302, the transceiver device handle airflow channel exit of the transceiver device handle airflow channel 416b defined by the transceiver device handle 416 is located immediately adjacent the heat dissipation device 414 and may be aligned with the transceiver device port air channel 308 located on the transceiver device port chassis 302 such that airflow may enter the transceiver device handle airflow channel 416b in the transceiver device handle 416, flow past the heat dissipation device 414, and exit through the transceiver device port air channel 308.

Figure 9:
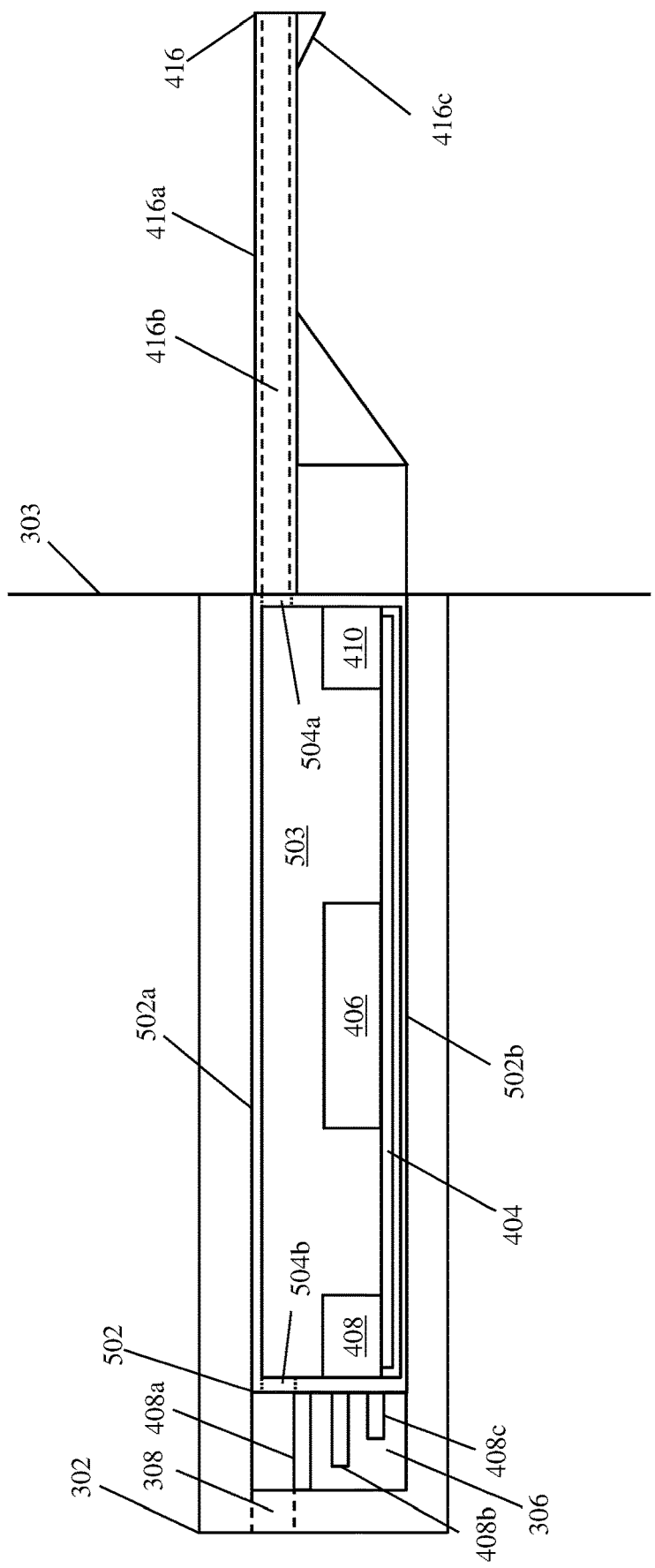
FIG. 9 is a side view illustrating an embodiment of the transceiver device of FIGS. 5A-5C connected to the transceiver device port of FIG. 3A during the method of FIG. 7.

With reference to FIG. 9, in an embodiment, the transceiver device 500 may be connected to the transceiver device port 300 similarly as described above for the connection of the transceiver device 400 and transceiver device port 300 with reference to FIGS. 8A and 8B. As can be seen in FIG. 9, when the transceiver device 500 is connected with the transceiver device port 300, the transceiver device handle 416 is aligned with the transceiver device base air entrance 504a, and may be aligned with either or both of the transceiver device base air exit 504b defined by the transceiver device base 504 and the transceiver device port air channel 308 located on the transceiver device port chassis 302, such that airflow may enter the transceiver device handle airflow channel 416b in the transceiver device handle 416, be directed through the transceiver device base air entrance 504a and into the component housing 503 defined by the transceiver device base 502, may exit the component housing 503 defined by the transceiver device base 502 through the transceiver device base air exit 504b, and may exit the transceiver device port 300 through the transceiver device port air channel 308.

Figure 10:
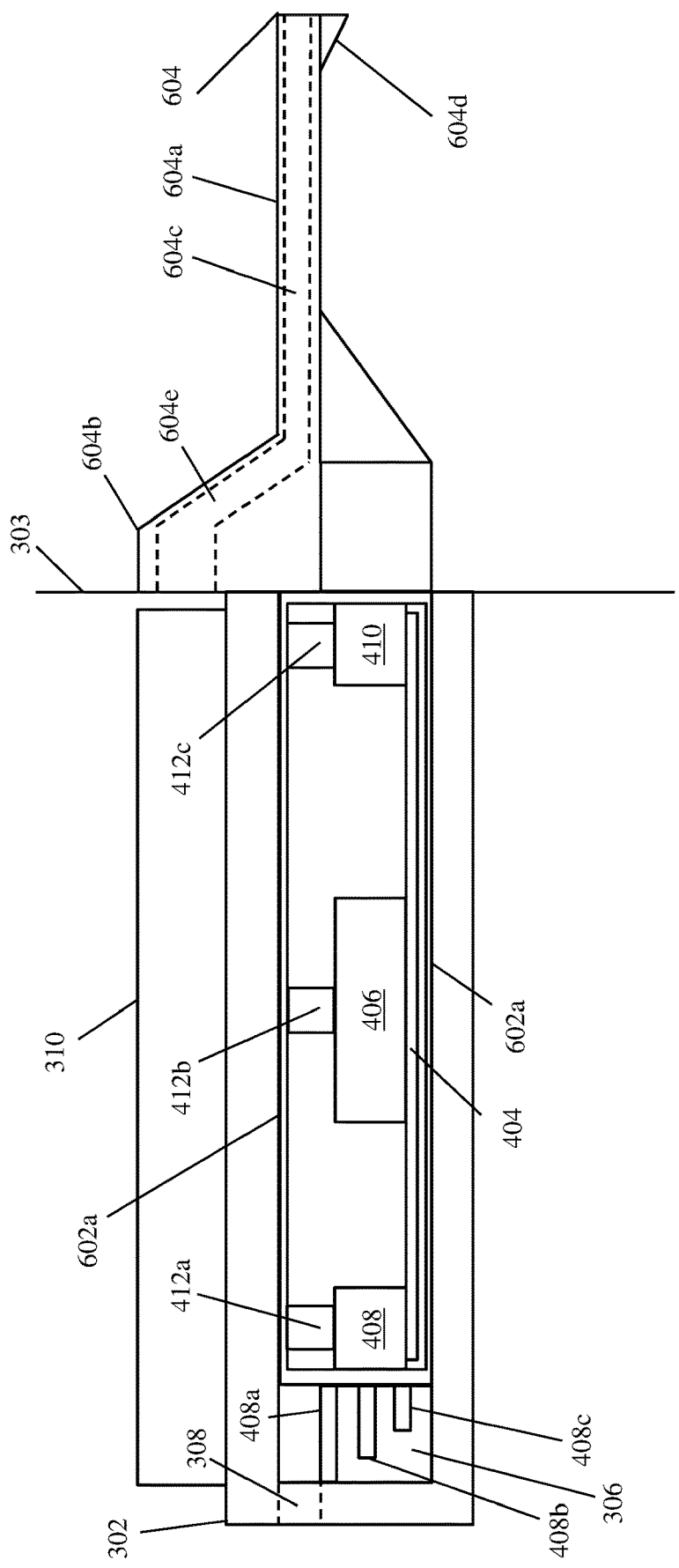
FIG. 10 is a side view illustrating an embodiment of the transceiver device of FIGS. 6A-6C connected to the transceiver device port of FIG. 3B during the method of FIG. 7.

With reference to FIG. 10, in an embodiment, the transceiver device 600 may be connected to the transceiver device port 300 similarly as described above for the connection of the transceiver device 400 and transceiver device port 300 described above with reference to FIGS. 8A and 8B. As can be seen in FIG. 10, when the transceiver device 600 is connected with the transceiver device port 300, the transceiver device handle airflow redirection element 604b on the transceiver device handle 604 is located adjacent the heat dissipation device 310 that engages the transceiver device port chassis 302 such that airflow may move through the transceiver device handle primary air channel 604c in the transceiver device handle 604, be redirected via the transceiver device handle airflow redirection channel 604e in the transceiver device handle airflow redirection element 604b, and flow past the heat dissipation device 310.

Figure 11A:
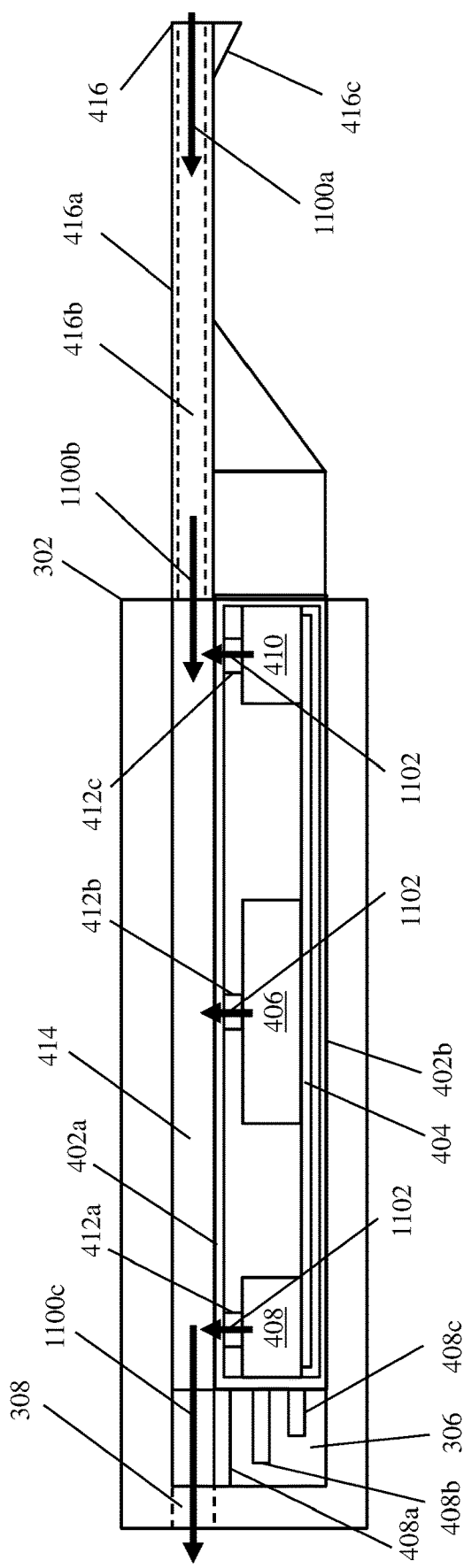
FIG. 11A is a side view of the transceiver device in the transceiver device port of FIG. 8B operating during the method of FIG. 7.
Figure 12A:
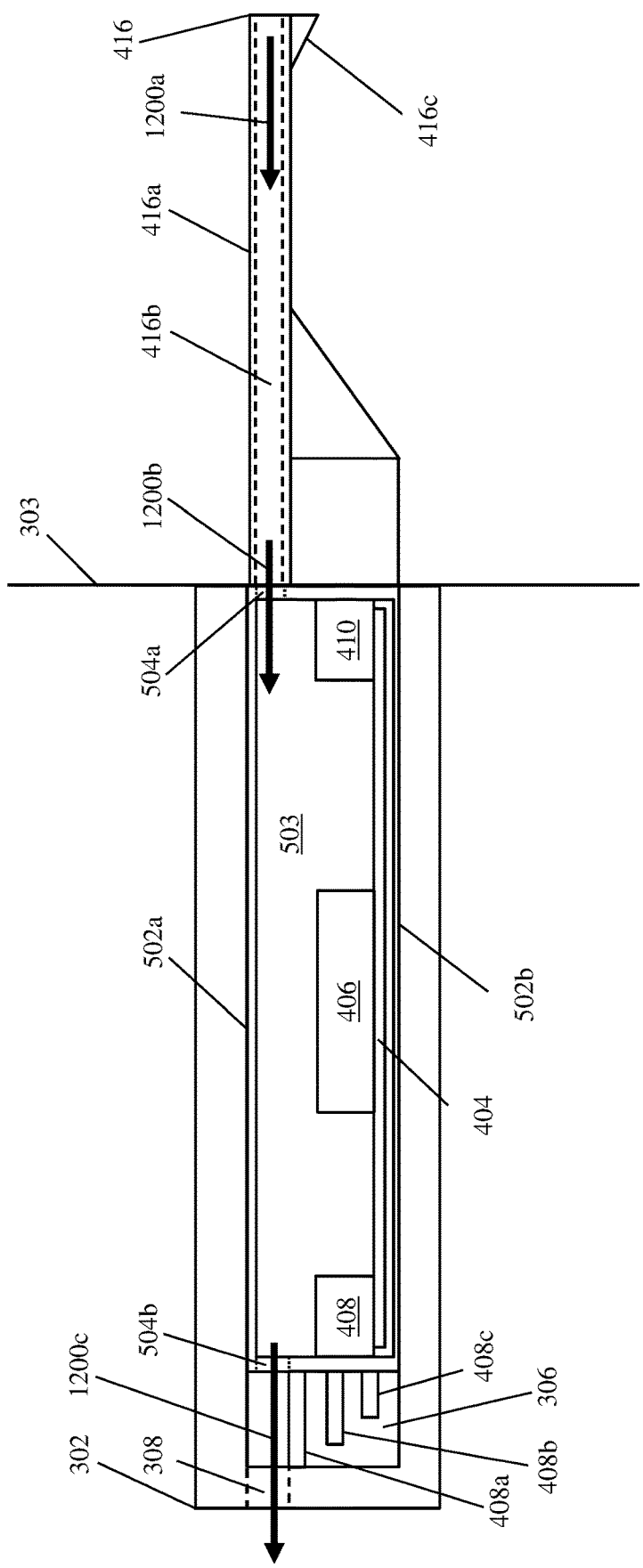
FIG. 12A is a side view of the transceiver device in the transceiver device port of FIG. 9 operating during the method of FIG. 7.
Figure 13A:
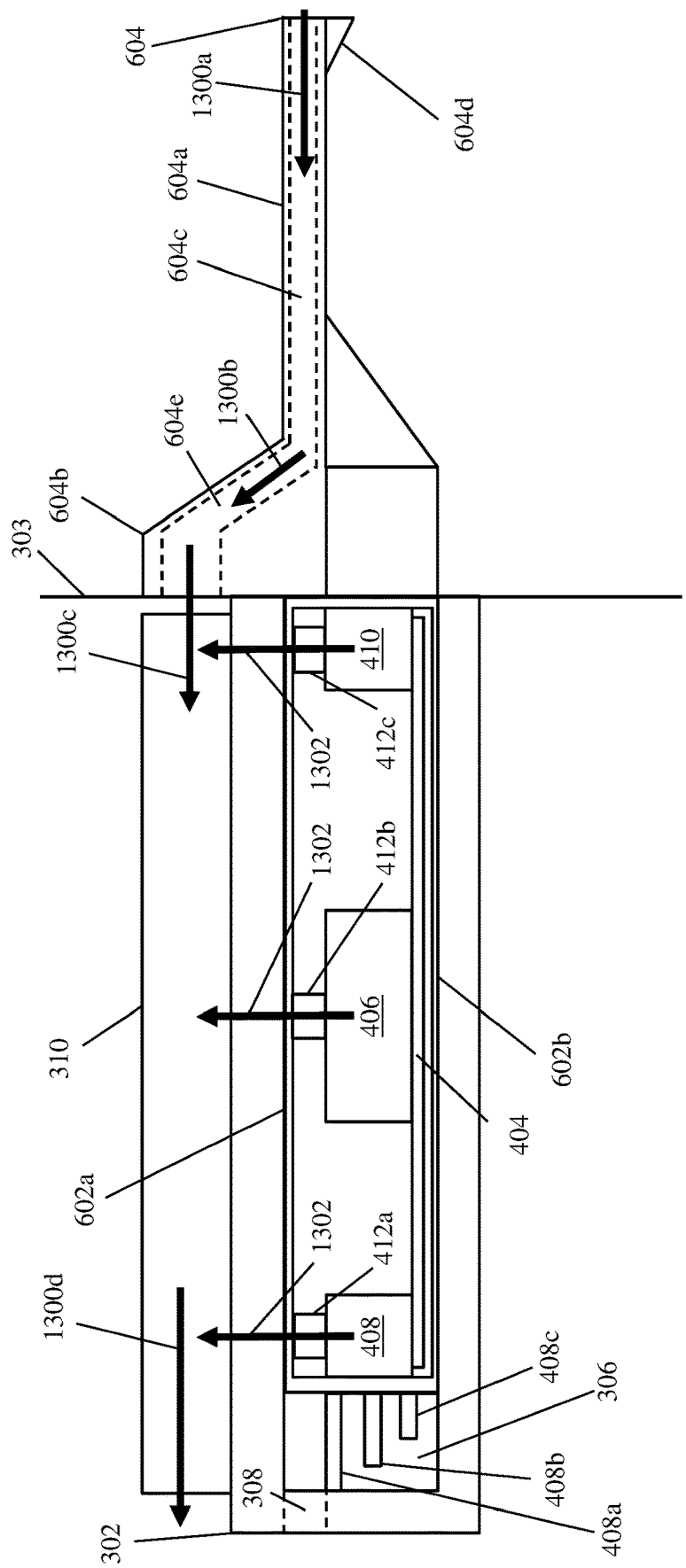
FIG. 13A is a side view of the transceiver device in the transceiver device port of FIG. 10 operating during the method of FIG. 7.

The method 700 then proceeds to block 704 where heat producing components in the transceiver device generate heat. With reference to FIGS. 11A, 12A, and 13A, in an embodiment of block 704, the transceiver devices 400, 500 and 600 may perform data transmission operations that may include the transfer of data between the networking device 200 and computing devices connected to the transceiver devices. As will be appreciated by one of skill in the art in possession of the present disclosure, the transmission of data between the networking device 200 and computing devices via the transceiver devices 400, 500 and 600 may result in the generation of heat by the heat producing components such as the transceiver device processing system 406, the transceiver device electrical connector 408, the transceiver device optical connector 410, and/or other components included in the transceiver device(s) 400, 500 and 600. In a specific example, the transceiver devices 400, 500 and 600 may receive data from the networking device 200 in the form of electrical signals, and may convert those electrical signals into optical signals for transmission via fiber optic connector systems to connected computing devices, and the conversion of electrical signals into optical signals may result in the generation of relatively high amounts of heat that require dissipation. However, while a specific example of the generation of heat by transceiver devices has been described, one of skill in the art in possession of the present disclosure will appreciate transceiver devices may generate heat in a variety of manners that will fall within the scope of the present disclosure as well.

As can be seen in FIG. 11A, the transceiver device processing system 406, the transceiver device electrical connector 408, and the transceiver device optical connector 410 may each generate heat 1102 that may be transferred via their respective heat transfer elements 412a. 412b, and 412c, through the transceiver device base 402, and to the heat dissipation device 414. Similarly, with reference FIG. 12A, the transceiver device processing system 406, the transceiver device electrical connector 408, and the transceiver device optical connector 410, may each generate heat during their operation, with the exception that the transceiver device 500 is not provided with any heat transfer elements or heat dissipation elements to assist in the dissipation of that heat. Similarly, with reference to FIG. 13A, the transceiver device processing system 406, the transceiver device electrical connector 408, and the transceiver device optical connector 410 may generate heat 1302 that may be transferred via their respective heat transfer element 412a, 412b, and 412c, through the transceiver device base 602, though the transceiver device port chassis 302, and to the heat dissipation device 310.

Figure 11B:
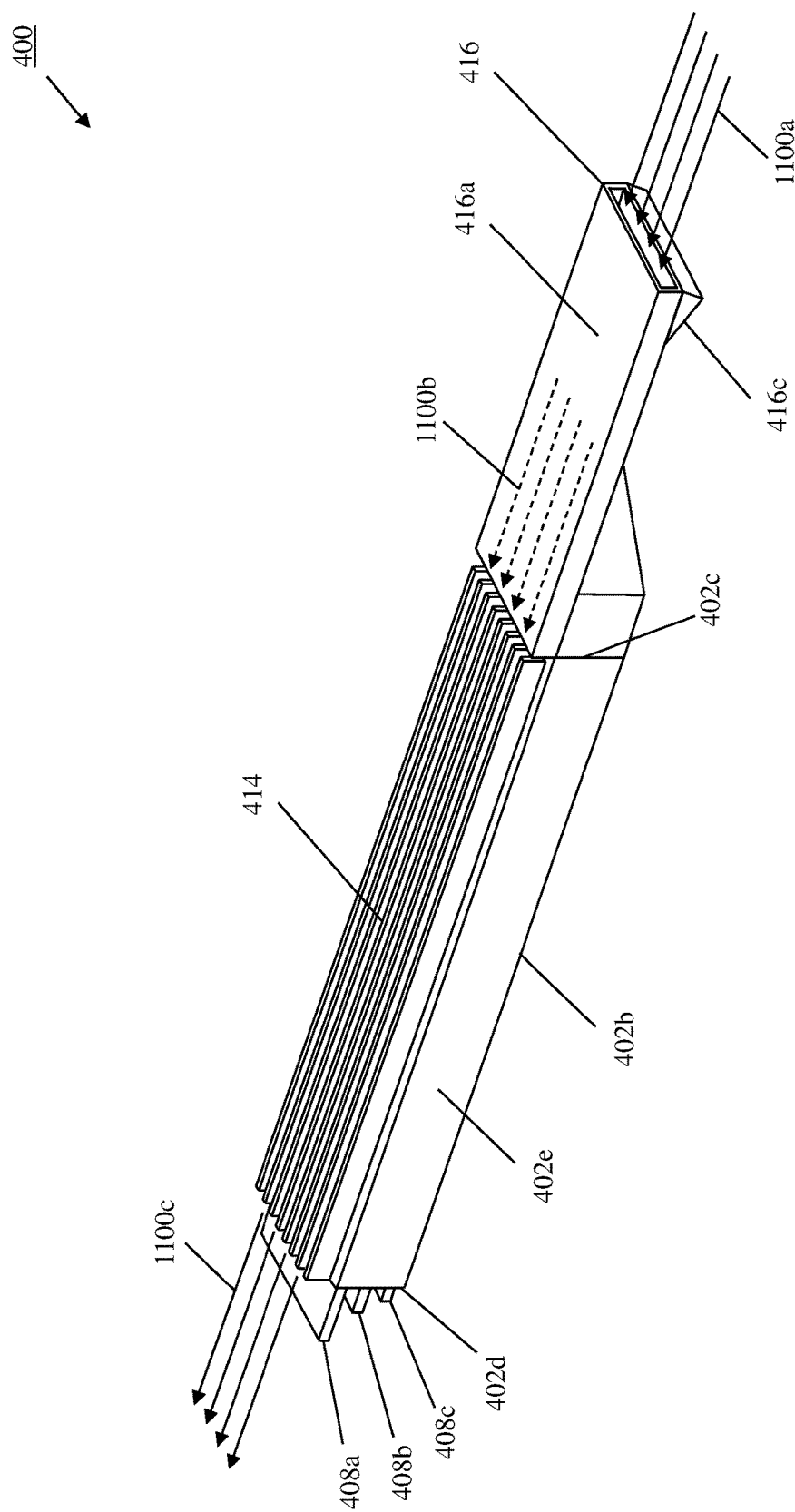
FIG. 11B is a perspective view of the transceiver device of FIGS. 4A-4C operating during the method of FIG. 7.

The method 700 then proceeds to block 706 where an airflow channel defined by a transceiver device handle receives airflow. With reference to FIGS. 11A and 11B, in an embodiment of block 706 using the transceiver device 400 of FIGS. 4A-4C, the transceiver device handle airflow channel 416b defined by the transceiver device handle 416 may receive an airflow 1100a via the transceiver device handle airflow channel entrance that is defined by the transceiver device handle 416. For example, in a data center environment where the transceiver device 400 may be connected to a networking device in a rack, the transceiver device handle 416 may extend into a relatively cold air aisle, enabling relatively cold air to enter the transceiver device handle airflow channel 416b. However, while a particular physical setting for receiving airflow via the transceiver device handle airflow channel of the present disclosure has been described, one of skill in the art in possession of the present disclosure will appreciate how different physical settings may enable the benefits of the present disclosure while remaining within its scope as well.

Figure 12B:
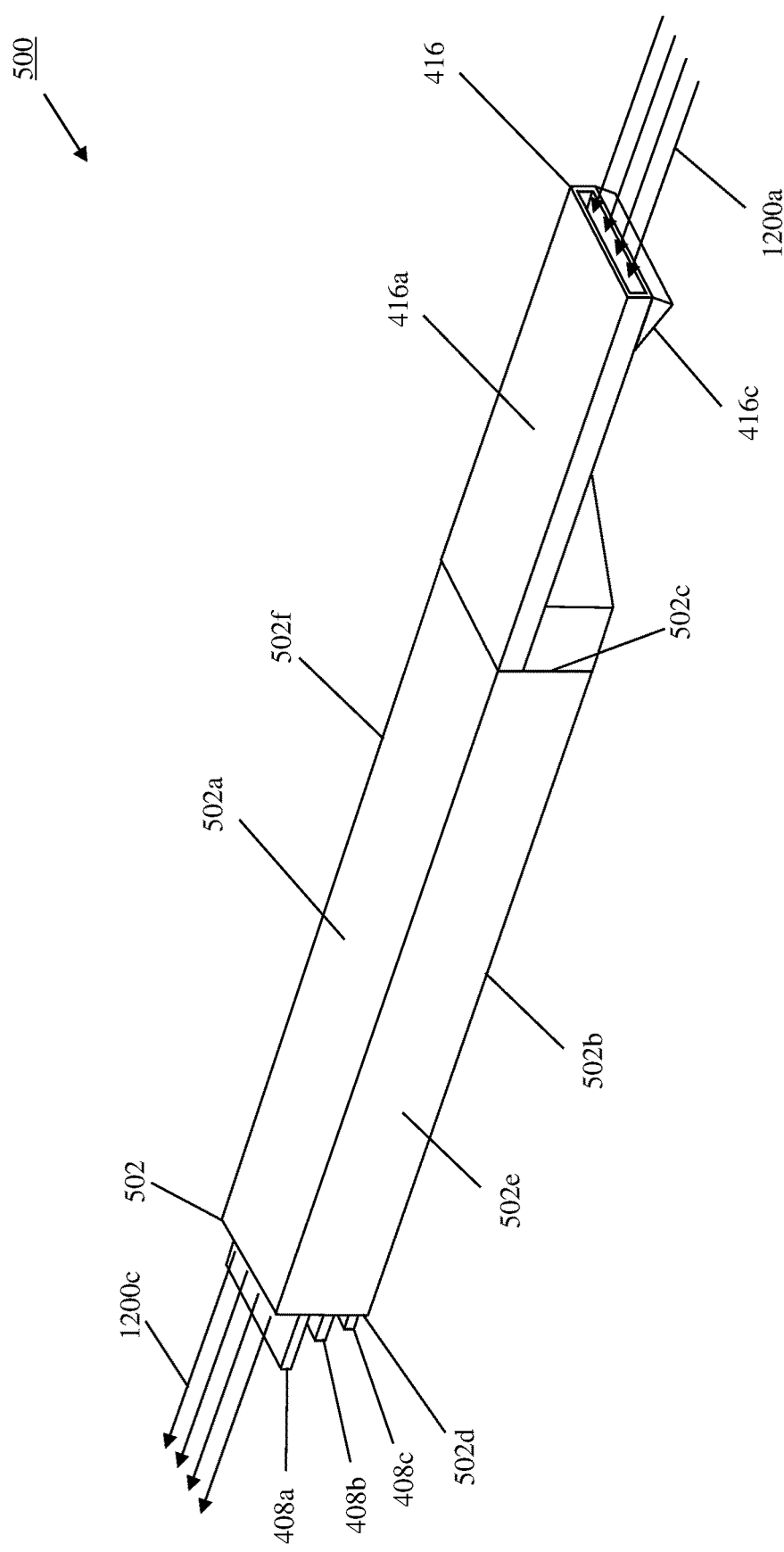
FIG. 12B is a perspective view of the transceiver device of FIGS. 5A-5C operating during the method of FIG. 7.

With reference to FIGS. 12A and 12B, in an embodiment of block 706 using the transceiver device 500 of FIGS. 5A-5C, the transceiver device handle airflow channel 416b defined by the transceiver device handle 416 may receive an airflow 1200a via the transceiver device handle airflow channel entrance that is defined by the transceiver device handle 416. Similarly as discussed above, in a data center environment where the transceiver device 500 may be connected to a networking device in a rack, the transceiver device handle 416 may extend into a relatively cold air aisle to enable relatively cold air to enter the transceiver device handle airflow channel 416b, but one of skill in the art in possession of the present disclosure will appreciate how different physical settings may enable the benefits of the present disclosure while remaining within its scope as well.

Figure 13B:
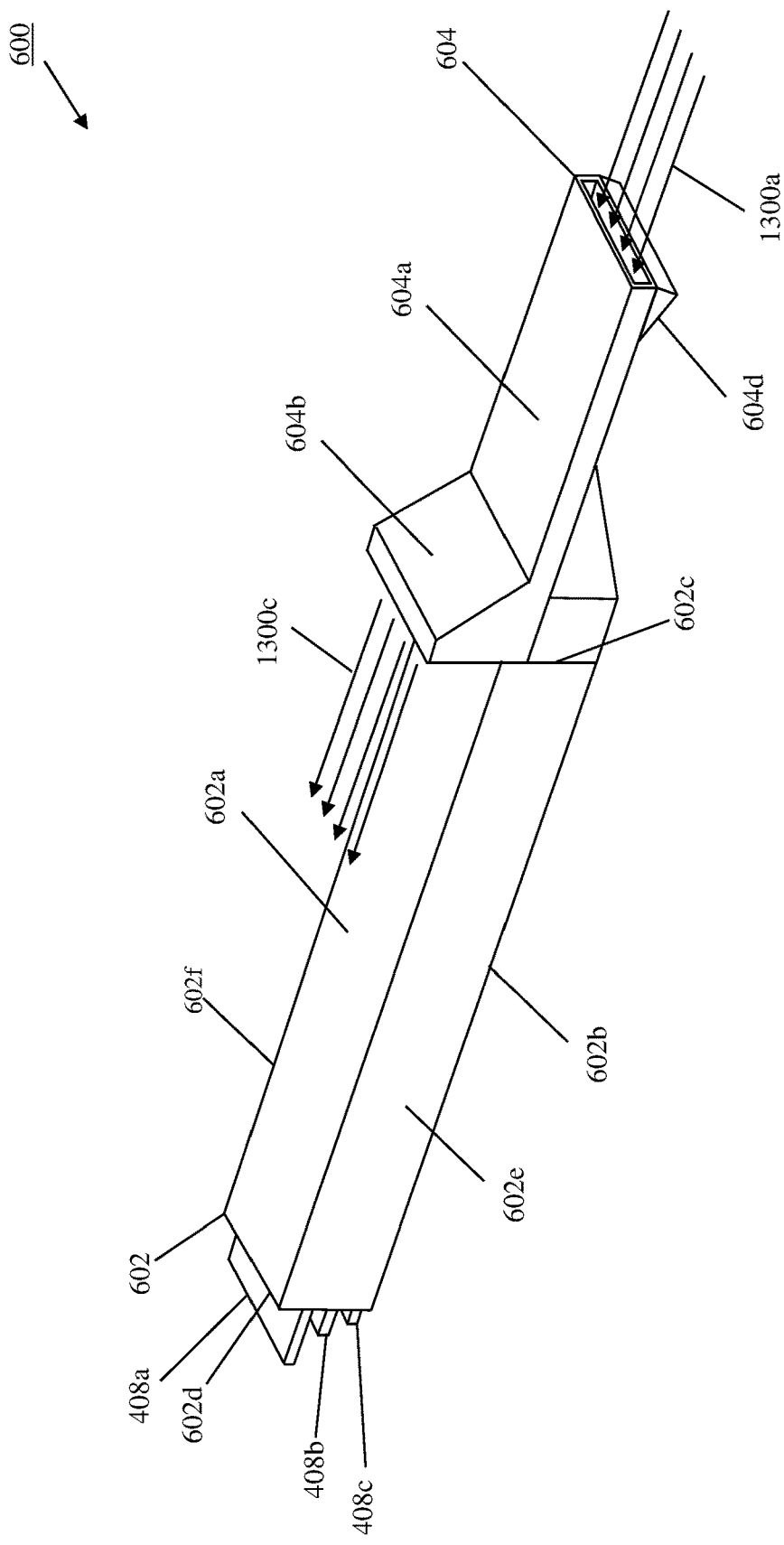
FIG. 13B is a perspective view of the transceiver device of FIGS. 6A-6C operating during the method of FIG. 7.

With reference to FIGS. 13A and 13B, in an embodiment of block 706 using the transceiver device 600 of FIGS. 6A-6C, the transceiver device handle primary airflow channel 604c defined by the transceiver device handle 604 may receive an airflow 1300a via the transceiver device handle airflow channel entrance that is defined by the transceiver device handle 604. Similarly as discussed above, in a data center environment where the transceiver device 600 may be connected to a networking device in a rack, the transceiver device handle 604 may extend into a relatively cold air aisle to enable relatively cold air to enter the transceiver device primary airflow channel 604c, but one of skill in the art in possession of the present disclosure will appreciate how different physical settings may enable the benefits of the present disclosure while remaining within its scope as well.

The method 700 then proceeds to block 708 where an airflow channel defined by a transceiver device handle directs airflow through the airflow channel. With reference back to FIGS. 11A and 11B, in an embodiment of block 708 using the transceiver device 400 of FIGS. 4A-4C, the airflow 1100a that entered the transceiver device handle airflow channel entrance defined by the transceiver device handle 416 moves through the transceiver device handle airflow channel 416b. As will be appreciated by one of skill in the art in possession of the present disclosure, the airflow 1100a will be directed by the transceiver device handle airflow channel 416b out of the transceiver device handle airflow channel exit and towards the heat dissipation device 414 as airflow 1100b. The airflow 1100b will then move through the heat dissipation device 414 (e.g., through channels defined between fins of the heat dissipation device 414 in the illustrated embodiment) until it passes the heat dissipation device 414 and exits the transceiver device port chassis 302 via the transceiver device port air channel 308 as airflow 1100c.

With reference to FIGS. 12A and 12B, in an embodiment of block 708 using the transceiver device 500 of FIGS. 5A-5C, the airflow 1200a that entered the transceiver device handle airflow channel entrance defined by the transceiver device handle 416 moves through the transceiver device handle airflow channel 416b. As will be appreciated by one of skill in the art in possession of the present disclosure, the airflow 1200a will be directed by the transceiver device handle airflow channel 416b out of the transceiver device handle airflow channel exit and into the component housing 503 defined by the transceiver device base 502 via the transceiver device base air entrance 504a as airflow 1200b. The airflow 1200b will then move through the component housing 503 defined by the transceiver device base 502 (e.g., over the heat producing components 406, 408 and 410 of the transceiver device 500) until it exits the component housing 503 defined by the transceiver device base 502 via the transceiver device base air exit 504b as airflow 1200c. The airflow 1200c will then exit the transceiver device port chassis 302 via the transceiver device port air channel 308.

With reference to FIGS. 13A and 13B, in an embodiment of block 708 using the transceiver device 600 of FIGS. 6A-6C, the airflow 1300a that entered the transceiver device handle primary airflow channel entrance defined by the transceiver device handle 604 moves through the transceiver device handle primary airflow channel 604c and is redirected by the transceiver device handle airflow redirection channel 604e as airflow 1300b. As will be appreciated by one of skill in the art in possession of the present disclosure, the airflow 1300b will then exit the transceiver device handle 604 at the transceiver device handle airflow channel exit as airflow 1300c that is directed towards the heat dissipation device 310. The airflow 1300c will then move through the heat dissipation device 310 (e.g., through channels defined between fins of the heat dissipation device 310 in the illustrated embodiment) until it exits the heat dissipation device 310 as airflow 1300d.

The method 700 then proceeds to block 710 where airflow directed through an airflow channel defined by a transceiver device handle dissipates heat generated by heat producing component(s) in a transceiver device. With reference to FIGS. 11A and 11B, in an embodiment of block 710 using the transceiver device 400 of FIGS. 4A-4C, the heat 1102 that was generated by the heat producing components of the transceiver device 400 and transferred to the heat dissipation device 414 will be dissipated. For example, and as will be appreciated by one of skill in the art in possession of the present disclosure, as the airflow 1100b moves through the heat dissipation device 414 (e.g., through channels defined between fins of the heat dissipation device 414 in the illustrated embodiment), the heat 1102 transferred to the heat dissipation device 414 may then be transferred to the airflow 1100b, and the airflow 1100b/1100c will carry that heat 1102 out of the transceiver device port chassis 302.

With reference to FIGS. 12A and 12B, in an embodiment of block 710 using the transceiver device 500 of FIGS. 5A-5C, heat generated by the heat producing components 406, 408 and 410 will be dissipated. For example, and as will be appreciated by one of skill in the art in possession of the present disclosure, as the airflow 1200b moves through the component housing 503 defined by the transceiver device base 502 that houses the heat producing components 406, 408 and 410, the heat generated by those heat producing components is transferred to the airflow 1200b, and the airflow 1200b/1200c will carry that heat out of the transceiver device port chassis 302 via the transceiver device base air exit 504b and the transceiver device port air channel 308.

With reference to FIGS. 13A and 13B, in an embodiment of block 710 using the transceiver device 600 of FIGS. 6A-6C, the heat 1302 that was generated by the heat producing components of the transceiver device 600 and transferred to the heat dissipation device 310 via the transceiver device port chassis 302 will be dissipated. For example, and as will be appreciated by one of skill in the art in possession of the present disclosure, as the airflow 1300c moves through the heat dissipation device 310 (e.g., through channels defined between fins of the heat dissipation device 310), the heat 1302 transferred to the heat dissipation device 310 may then be transferred to the airflow 1300c, and the airflow 1300c/1300d will carry the heat 1302 away from the heat dissipation device 310.

Figure 14:
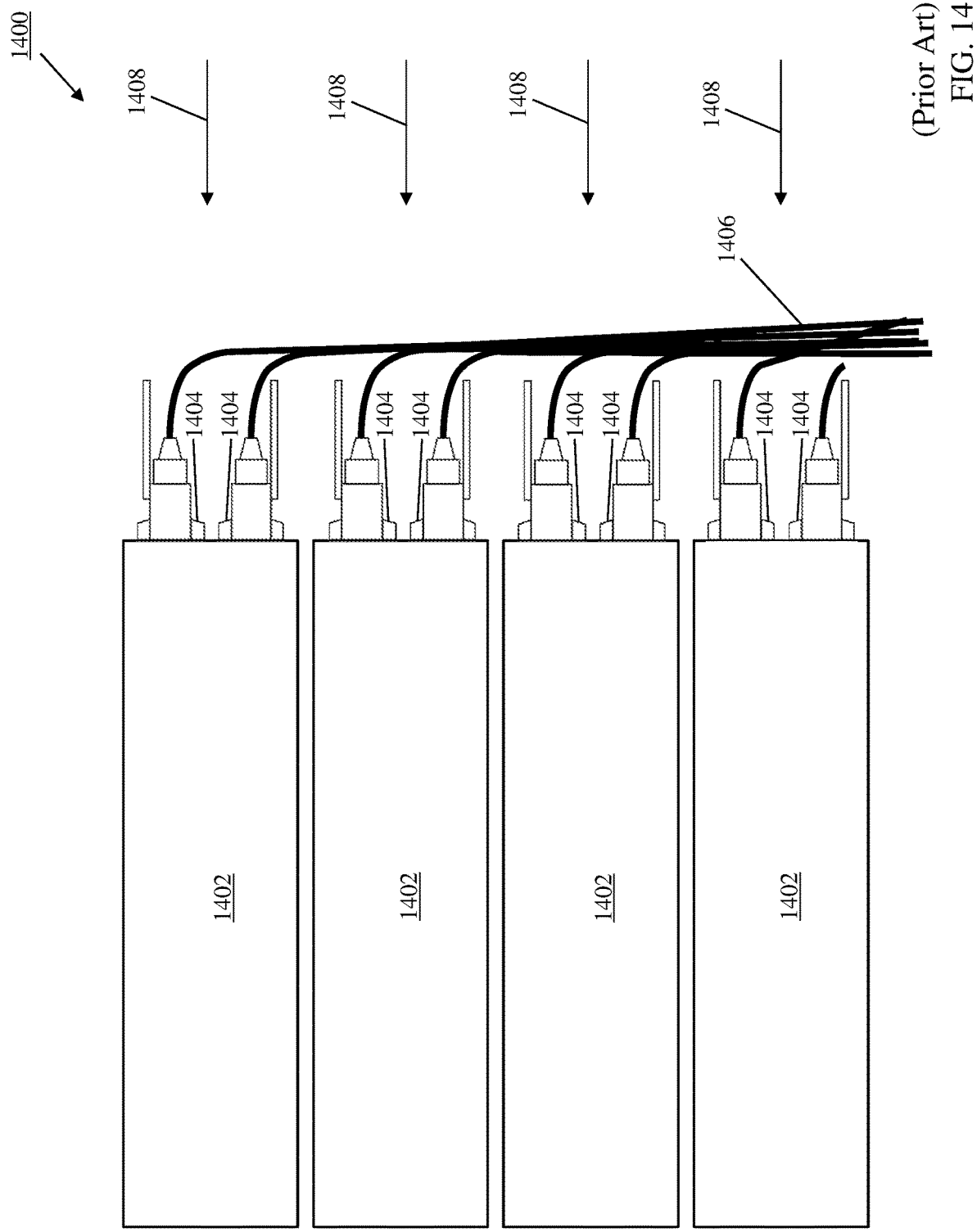
FIG. 14 is a side view illustrating an embodiment of conventional transceiver devices connected to networking devices and cabled to other computing devices.

With reference to FIG. 14, an embodiment of conventional transceiver devices connected to networking devices in a rack is illustrated. As can be seen in FIG. 14, a plurality of networking devices 1402 (e.g., switches, routers and/or other networking devices known in the art) may be included in a rack or other chassis (not illustrated), with a plurality of transceiver devices 1404 connected to the networking devices 1402, and a respective cable (e.g., a Direct Attach Cable (DAC), an optical cable, etc.) connected to each transceiver device 1404. As discussed above, the networking devices 1402 may face a cold air aisle that provides a relatively cold airflow 1408 to cool the networking devices 1402 and transceiver devices 1404. As discussed above, when conventional transceiver devices are utilized in networking devices in a rack, cables 1406 extending from the transceiver devices 1404 may impede cooling airflow from reaching those transceiver devices 1404, creating difficulties in the cooling of those transceiver devices 1404. For example, as can be seen in FIG. 14, the cables 1406 extending from the transceiver devices 1404 connected to the networking devices 1402 may create a barrier of cabling in front of the transceiver devices 1404 (e.g., due to poor cable management practices) that hinder the relatively cold airflow 1408 from reaching the transceiver devices 1404. However, while a particular example of issues with conventional transceiver device cooling systems have been described, one of skill in the art in possession of the present disclosure will appreciate how airflow to transceiver devices may be impeded in other manners that will fall within the scope of the present disclosure as well.

Figure 15:
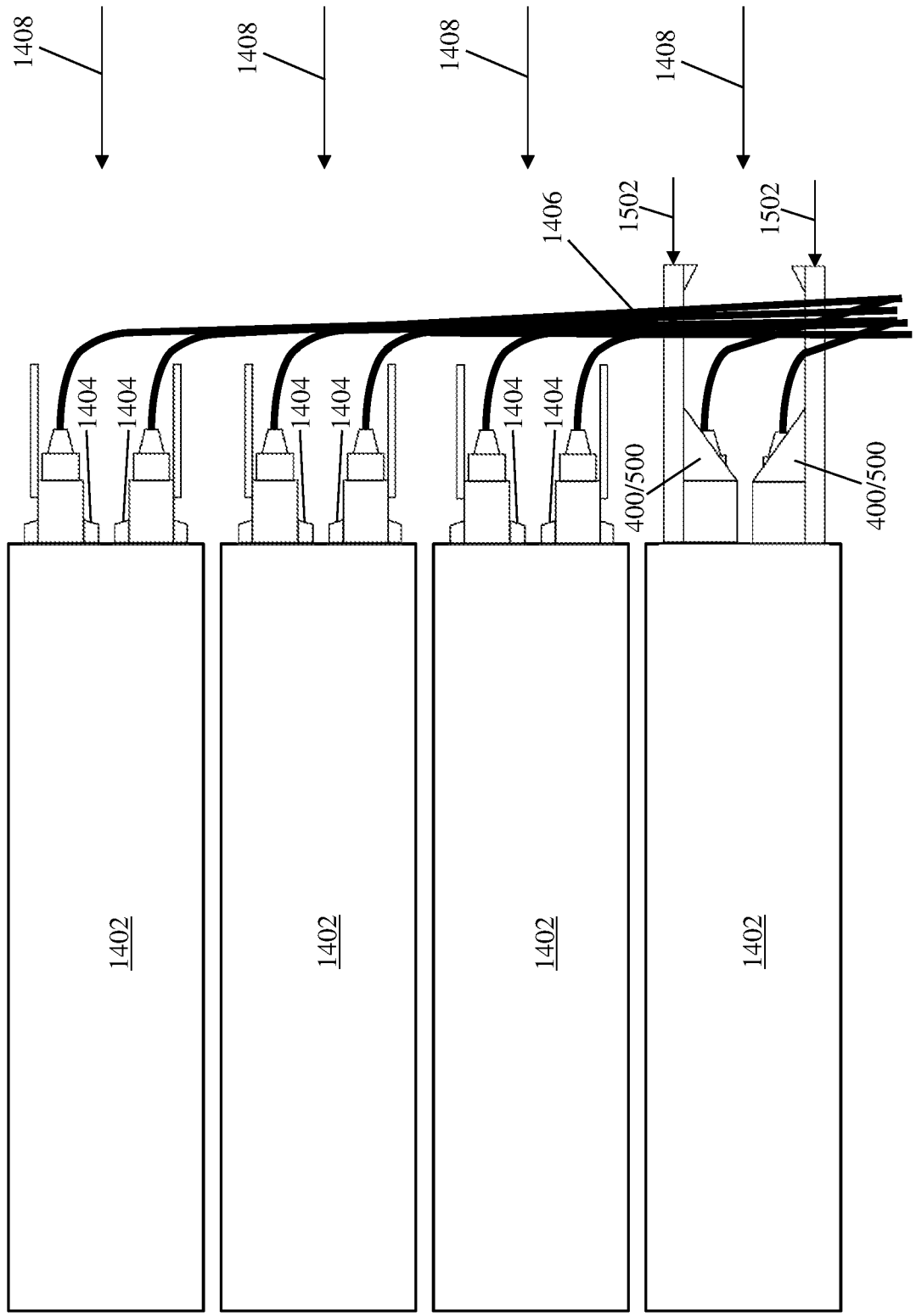
FIG. 15 is a side view illustrating an embodiment of either of the transceiver devices of FIGS. 4A-4C and FIGS. 5A-5C connected to networking devices, cabled to other computing devices, and operating during the method of FIG. 7.

With reference to FIG. 15, an embodiment of the transceiver devices 400/500 including the transceiver handle heat dissipation airflow channeling system of the present disclosure is illustrated connected to a networking device in a rack. In the illustrated embodiment, a pair of the transceiver devices 400/500 are connected to one of the networking devices 1402 discussed above with reference to FIG. 14. As can be seen in FIG. 15, the transceiver device handle 416 on each of the transceiver devices 400/500 extends past the cables 1406 that otherwise impede or hinder the relatively cold airflow 1408 to the conventional transceiver devices 1404, allowing the relatively cold airflow 1408 to enter the transceiver device handle airflow channel 416b as airflow 1502. As discussed above, the transceiver device handle airflow channel 416b will direct the airflow 1502 such that it may be used to dissipate heat generated by the components in the transceiver devices 400/500 (e.g., either directly or via the heat dissipation device 414).

Figure 16:
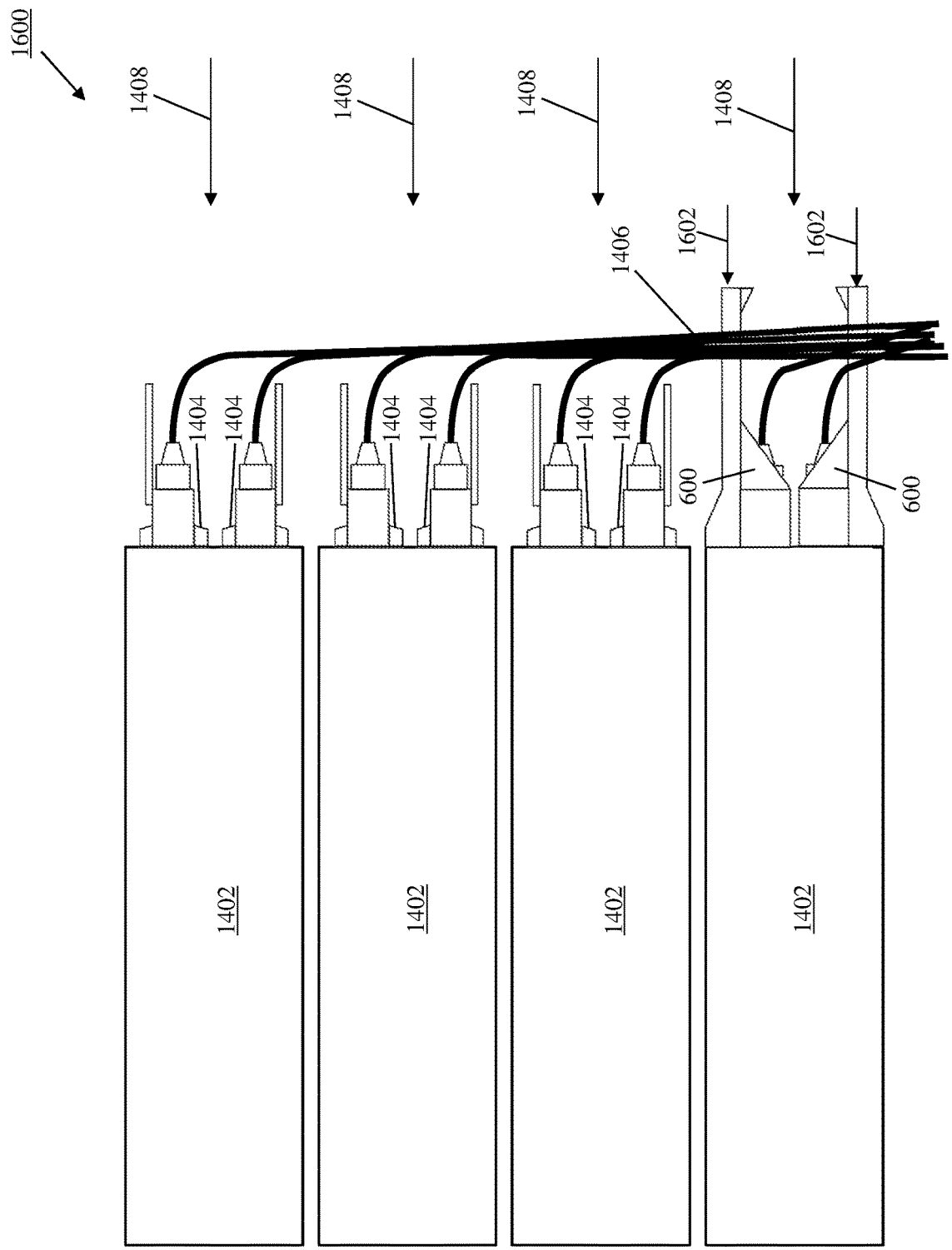
FIG. 16 is a side view illustrating an embodiment of the transceiver devices of FIGS. 6A-6C connected to networking devices, cabled to other computing devices, and operating during the method of FIG. 7.

With reference to FIG. 16, an embodiment of the transceiver device 600 including the transceiver handle heat dissipation airflow channeling system of the present disclosure is illustrated connected to a networking device in a rack. In the illustrated embodiment, a pair of the transceiver devices 600 are connected to one of the networking devices 1402 discussed above with reference to FIG. 14. As can be seen in FIG. 16, the transceiver device handle 604 on each of the transceiver devices 600 extends past the cables 1406 that otherwise impede or hinder the relatively cold airflow 1408 to the conventional transceiver devices 1404, allowing the relatively cold airflow 1408 to enter the transceiver device handle airflow channel 604c as airflow 1602. As discussed above, the transceiver device handle airflow channels 604c and 604e will direct the airflow 1602 such that it may be used to dissipate heat generated by the components in the transceiver devices 600 (e.g., via the heat dissipation device 310 connected to the transceiver device port 310).

Figure 17A:
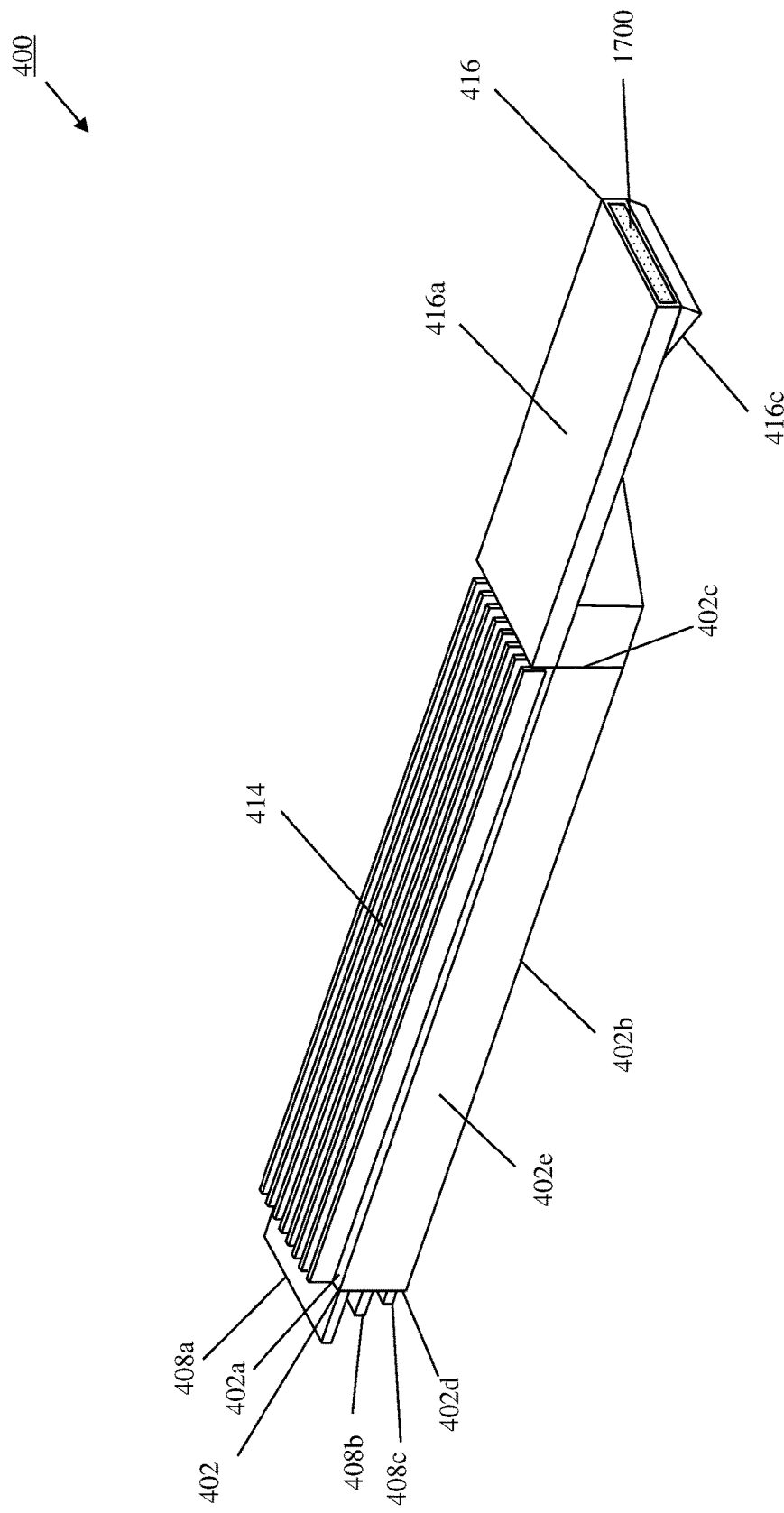
FIG. 17A is a perspective view illustrating an embodiment of the transceiver device of FIGS. 4A-4C including a transceiver handle airflow channel filter.
Figure 17B:
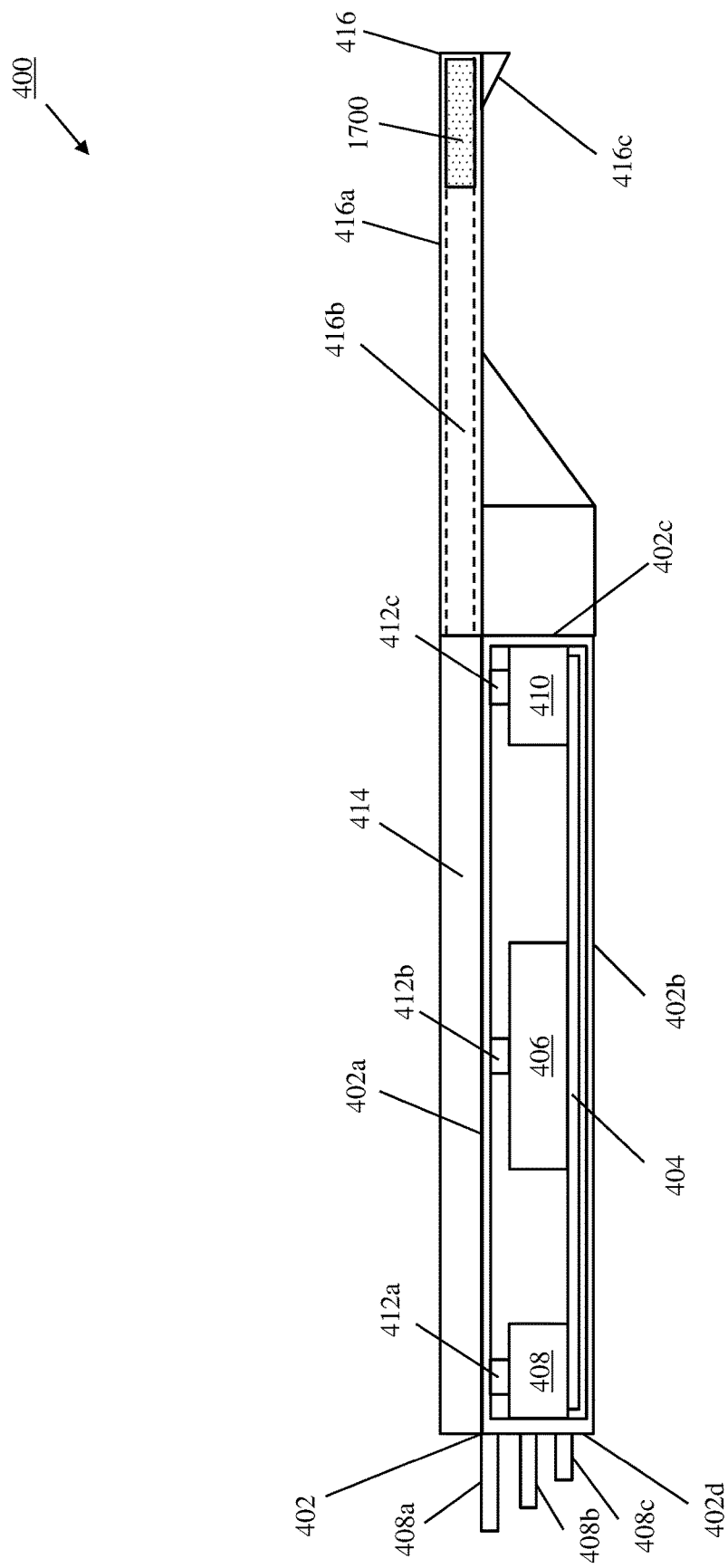
FIG. 17B is a side view illustrating an embodiment of the transceiver device of FIG. 17A.
Figure 17C:
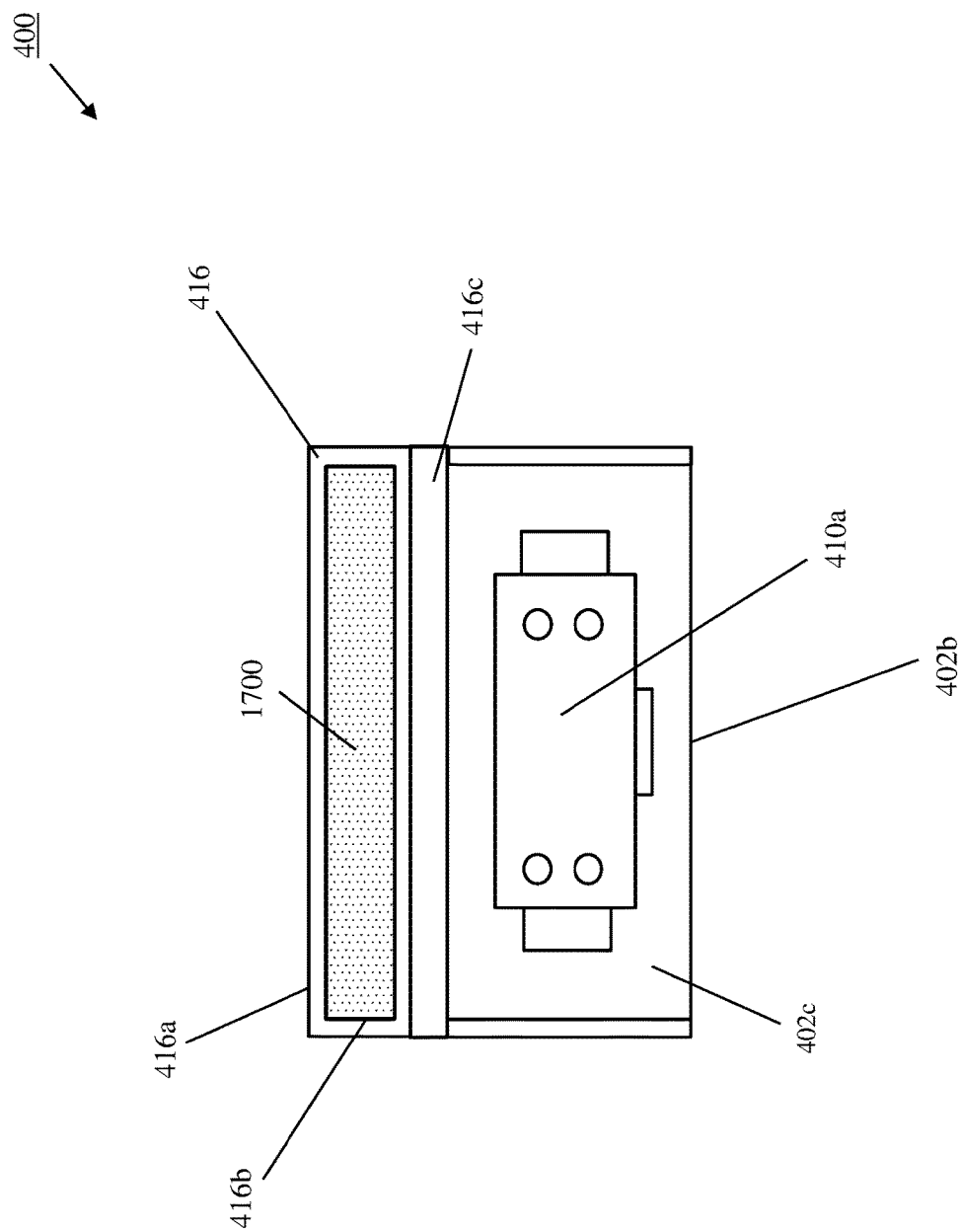
FIG. 17C is a front view illustrating an embodiment the transceiver device of FIGS. 17A and 17B.

With reference to FIGS. 17A, 17B and 17C, in an embodiment, the transceiver device 400 may include an optional air filter device 1700. As will be appreciated by one of skill in the art in possession of the present disclosure, the air filter device 1700 may be inserted through the transceiver device handle airflow channel entrance and into the transceiver device handle airflow channel 416b, and may operate to prevent dust or other particulate matter from entering the transceiver device port and/or networking devices to which that transceiver device 400 is connected. As can be seen in FIG. 17B, the air filter 1700 may be placed relatively close to the transceiver device handle airflow channel entrance to allow a user to easily replace the air filter 1700 periodically. In specific examples, the air filter 1700 may include replaceable pads provided by fiberglass, activated carbon, various types of filtering plastics, and/or other materials that one of skill in the art in possession of the present disclosure would recognize as capable of filtering out particles from airflow.

Figure 18A:
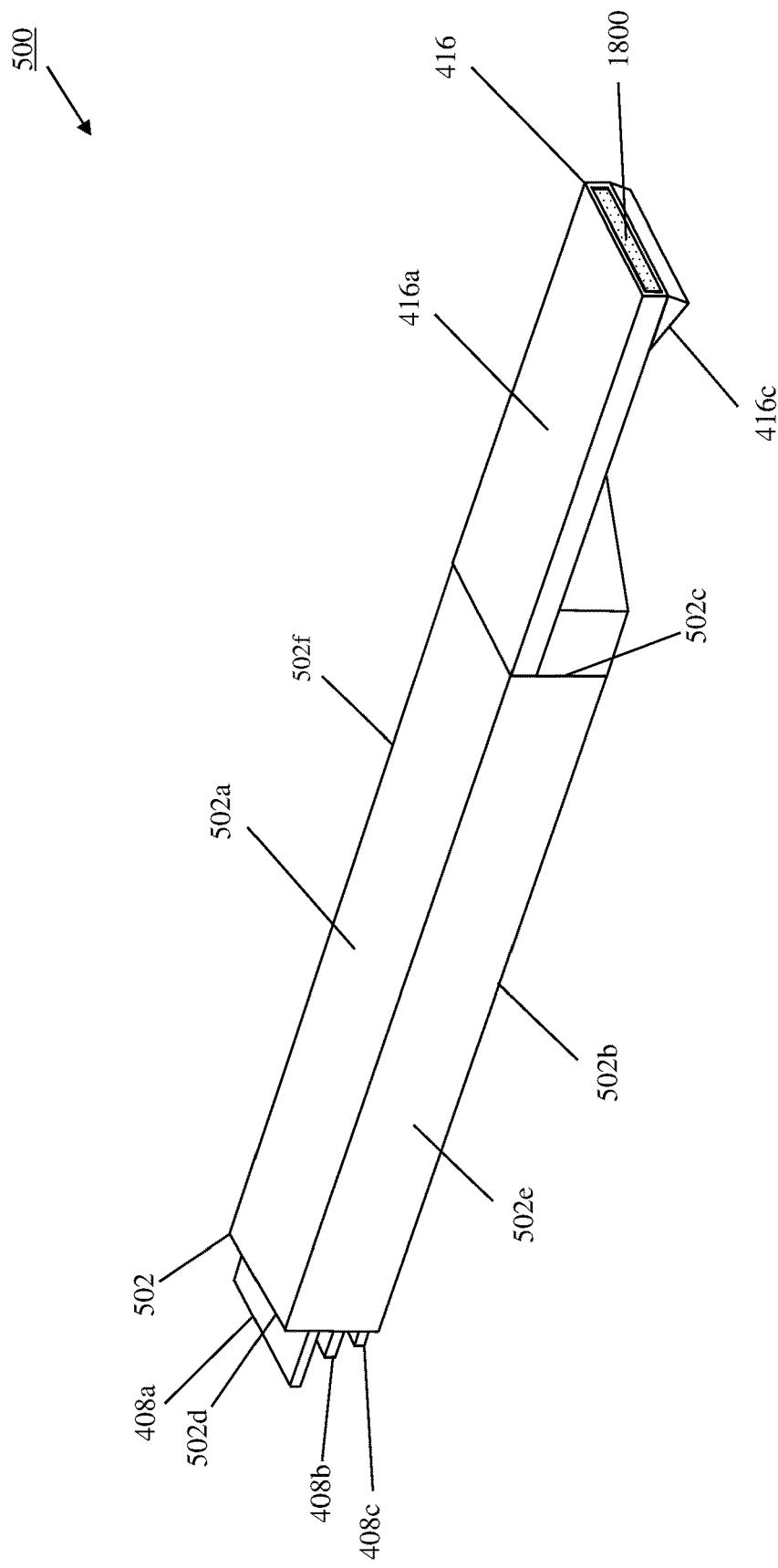
FIG. 18A is a perspective view illustrating an embodiment of the transceiver device of FIGS. 5A-5C including a transceiver handle airflow channel filter.
Figure 18B:
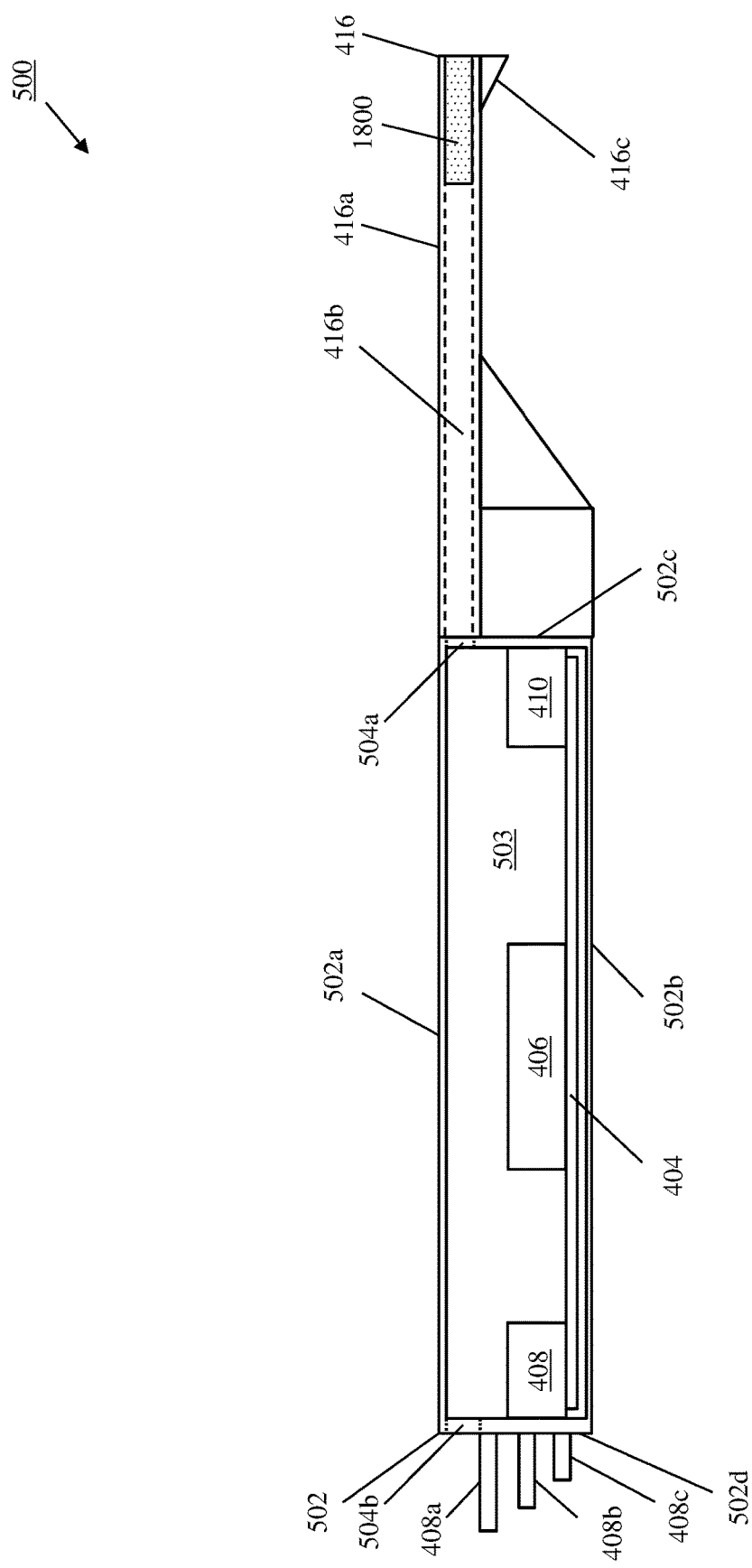
FIG. 18B is a side view illustrating an embodiment of the transceiver device of FIG. 18A.
Figure 18C:
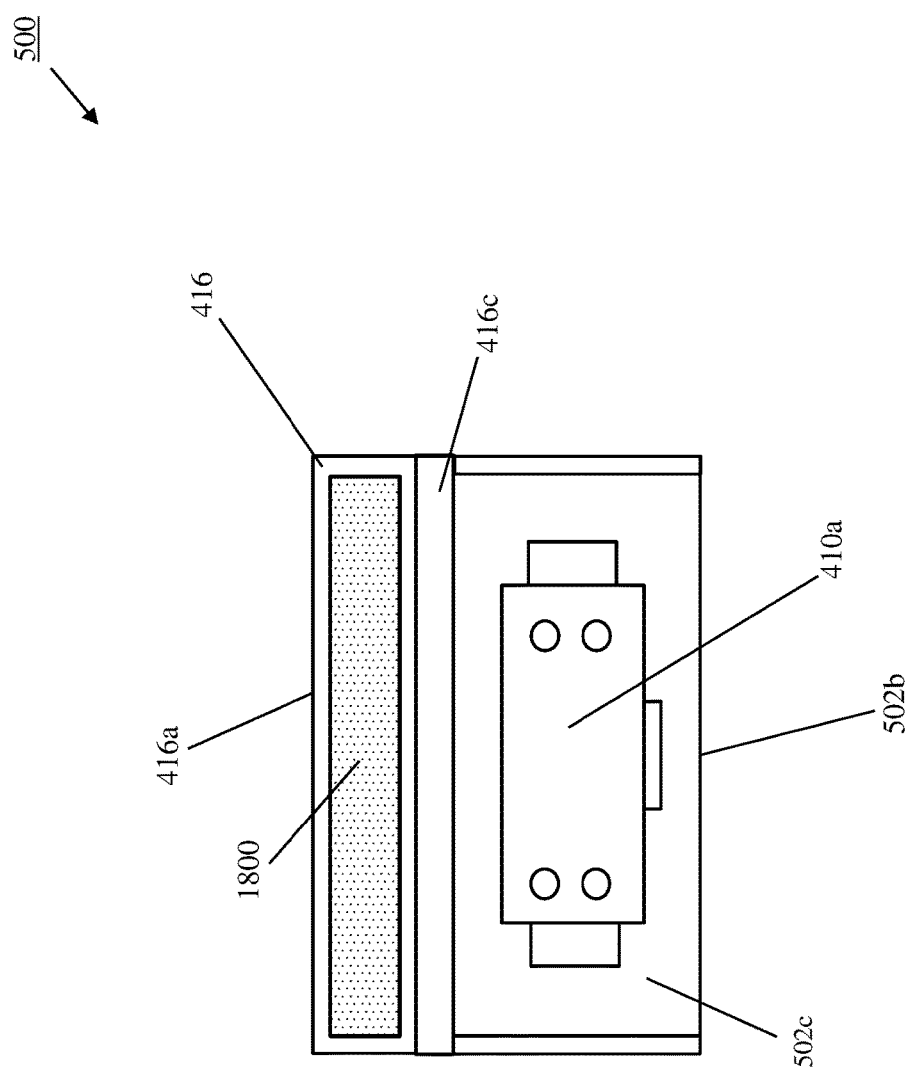
FIG. 18C is a front view illustrating an embodiment the transceiver device of FIGS. 18A and 18B.

With reference to FIGS. 18A, 18B and 18C, in an embodiment, the transceiver device 500 may include an optional air filter device 1800. As will be appreciated by one of skill in the art in possession of the present disclosure, the air filter device 1800 may be inserted through the transceiver device handle airflow channel entrance and into the transceiver device handle airflow channel 416b, and may operate to prevent dust or other particulate matter from entering the transceiver device port and/or networking devices to which that transceiver device 500 is connected. As can be seen in FIG. 18B, the air filter 1800 may be placed relatively close to the transceiver device handle airflow channel entrance to allow a user to easily replace the air filter 1800 periodically. Similarly as described above, the air filter 1800 may include replaceable pads provided by fiberglass, activated carbon, various types of filtering plastics, and/or other materials that one of skill in the art in possession of the present disclosure would recognize as capable of filtering out particles from airflow.

Figure 19A:
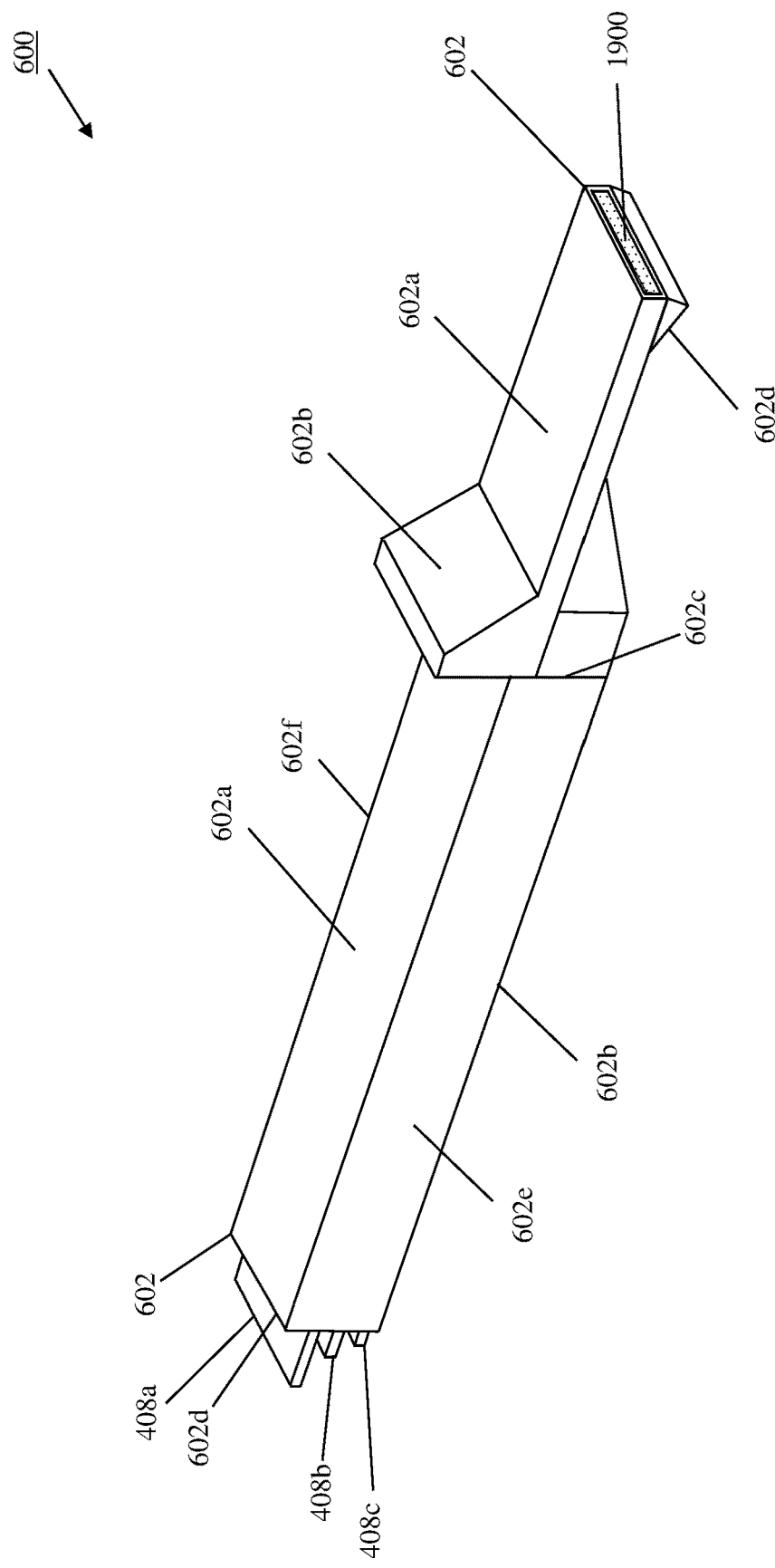
FIG. 19A is a perspective view illustrating an embodiment of the transceiver device of FIGS. 6A-6C including a transceiver handle airflow channel filter.
Figure 19B:
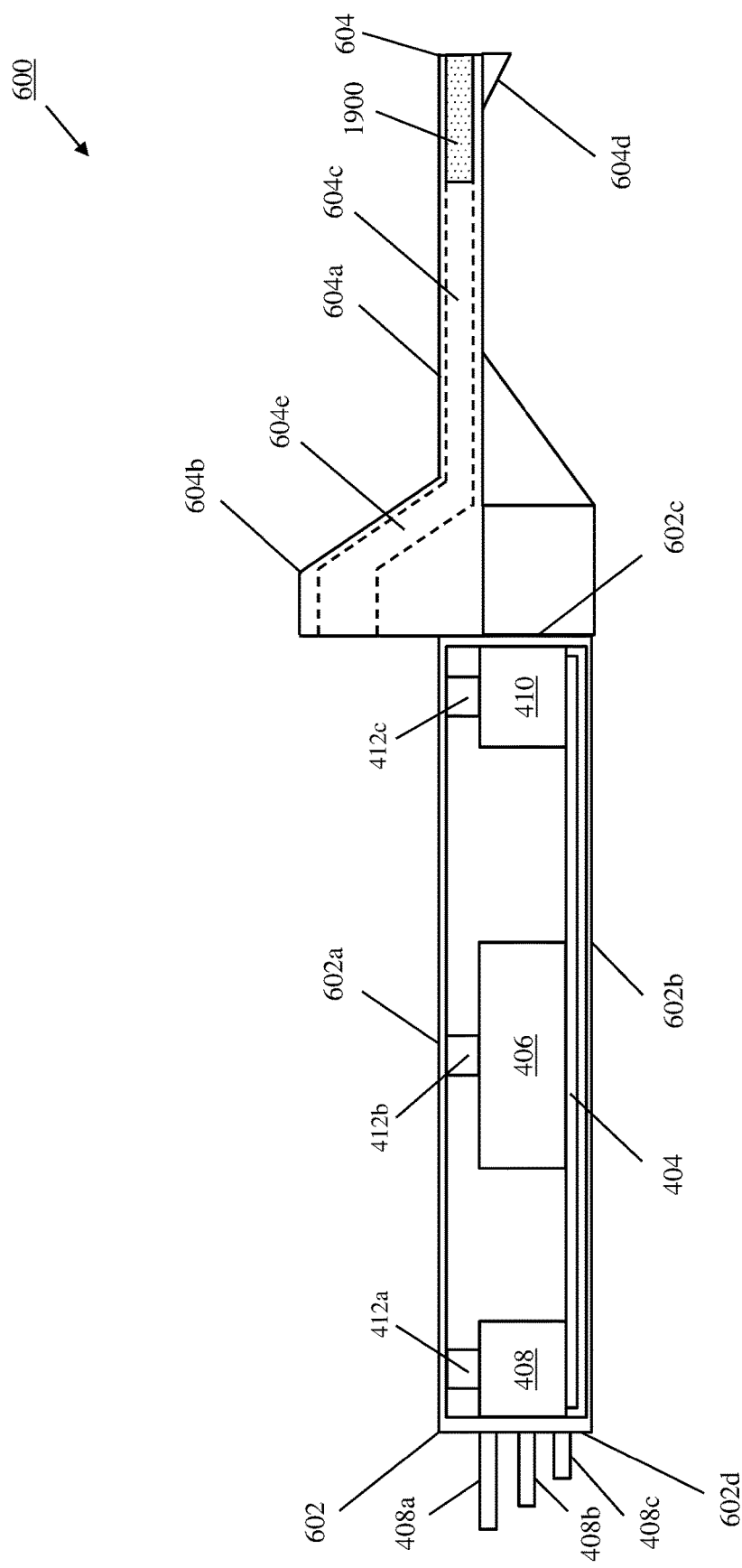
FIG. 19B is a side view illustrating an embodiment of the transceiver device of FIG. 19A.
Figure 19C:
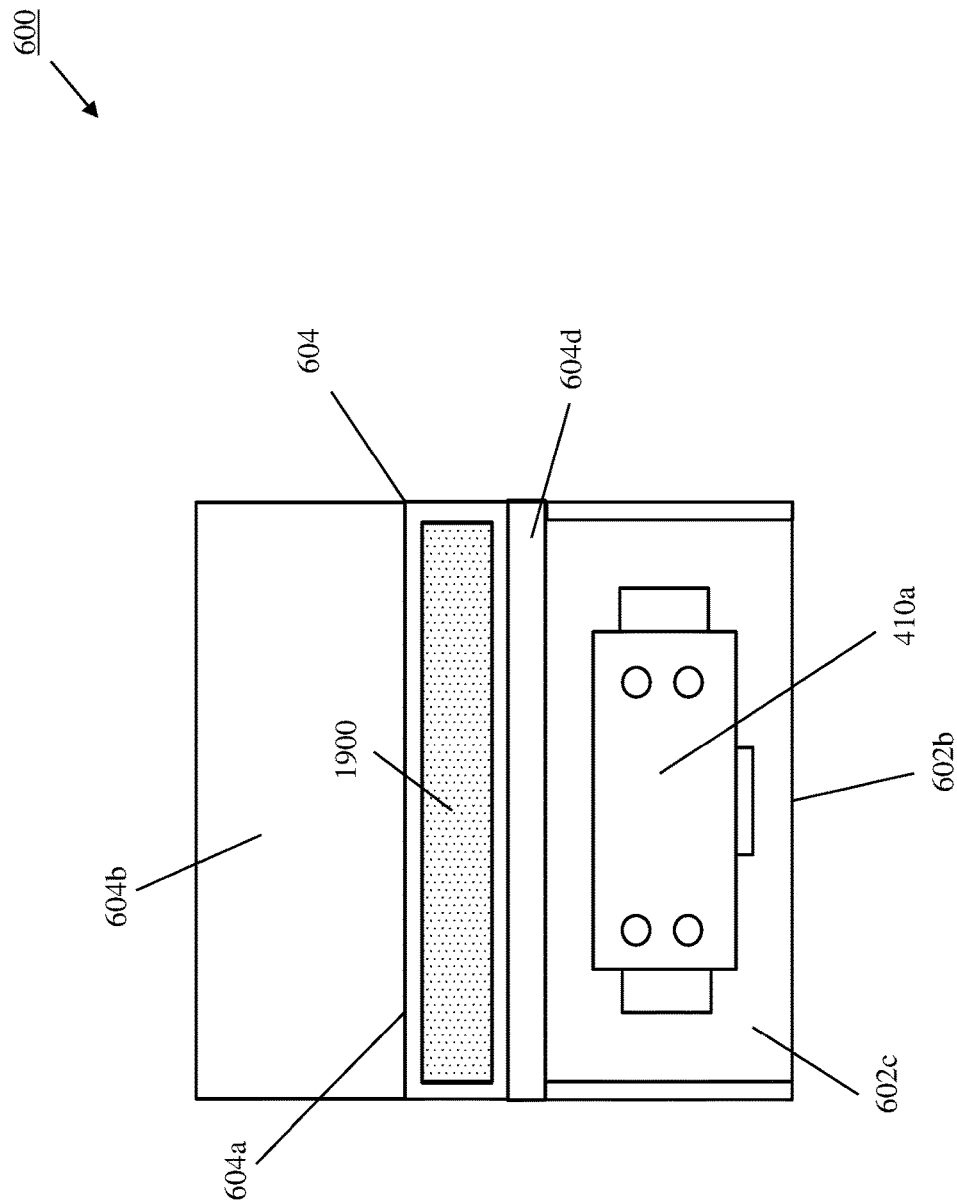
FIG. 19C is a front view illustrating an embodiment the transceiver device of FIGS. 19A and 19B.

With reference to FIGS. 19A, 19B and 19C, in an embodiment, the transceiver device 600 may include an optional air filter device 1900. As will be appreciated by one of skill in the art in possession of the present disclosure, the air filter device 1900 may be inserted through the transceiver device handle airflow channel entrance and into the transceiver device handle primary air channel 604c, and may operate to prevent dust or other particulate matter from entering the transceiver device port and/or networking devices to which that transceiver device 600 is connected. As can be seen in FIG. 19B, the air filter 1900 may be placed relatively close to the transceiver device handle airflow channel entrance to allow a user to easily replace the air filter 1900 periodically. Similarly as described above, the air filter 1900 may include replaceable pads provided by fiberglass, activated carbon, various types of filtering plastics, and/or other materials that one of skill in the art in possession of the present disclosure would recognize as capable of filtering out particles from airflow. However, while several specific examples of air filters have been described, one of skill in the art in possession of the present disclosure will appreciate how the transceiver handle heat dissipation airflow channeling system may filter the airflow provided therein in a variety of manners while remaining within the scope of the present disclosure.

Thus, systems and methods have been described that provide for a transceiver device handle that is configured to receive airflow at an airflow channel entrance, direct that airflow at heat generated by heat producing components in the transceiver device, and dissipate that heat. For example, the transceiver handle heat dissipation airflow channeling system of the present disclosure may include a transceiver device, a transceiver device chassis, at least one heat producing component that is housed in the transceiver device chassis and a transceiver device handle that extends from the transceiver device chassis and that defines an airflow channel along its length. When the transceiver handle heat dissipation airflow channeling system is engaged with the transceiver device chassis, the transceiver handle heat dissipation airflow channeling system may receive airflow at an airflow channel entrance defined by the transceiver device handle, direct the airflow through the airflow channel, and dissipate heat generated by the at least one heat producing component using the airflow. As such, the transceiver handle heat dissipation airflow channeling system of the present disclosure allows a transceiver device handle on a transceiver device to provide airflow to dissipate heat generated by heat producing components in a transceiver device, and may be particularly useful in situations where airflow may be impeded by cabling systems and/or other sources of airflow hindrance.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A transceiver device, comprising:
   a transceiver device chassis;
   at least one heat producing component that is housed in the transceiver device chassis; and
   a transceiver device handle that extends from the transceiver device chassis, that defines an airflow channel along its length, and that defines an airflow channel entrance to the airflow channel, wherein the transceiver device handle is configured to:
     extend, when the transceiver device chassis is positioned in a transceiver device port, past at least one cable such that airflow to the airflow channel via the airflow channel entrance is not obstructed by the at least one cable;
     receive airflow at the airflow channel entrance;
     direct the airflow through the airflow channel; and
     dissipate heat generated by the at least one heat producing component using the airflow directed through the airflow channel.

2. The system of claim 1, further comprising:
   a heat dissipation device that extends from the transceiver device chassis and that is configured to receive the heat generated by the at least one heat producing component, wherein the transceiver device handle is configured to direct the airflow from the airflow channel through the heat dissipation device to dissipate the heat generated by the at least one heat producing component.

3. The system of claim 1, wherein the transceiver handle is configured to direct the airflow from the airflow channel into a transceiver device chassis housing defined by the transceiver device chassis to dissipate the heat generated by the at least one heat producing component.

4. The system of claim 1, further comprising: a heat dissipation device that extends from the transceiver device port and that is configured to receive the heat generated by the at least one heat producing component and transmitted via the transceiver device chassis to the transceiver device port, wherein the transceiver device handle is configured to direct the airflow from the airflow channel through the heat dissipation device to dissipate the heat generated by the at least one heat producing component.

5. The system of claim 4, wherein the airflow channel defined by the transceiver device handle includes a primary airflow portion that extends from the airflow channel entrance, and a secondary airflow portion that redirects airflow towards the heat dissipation device.

6. The system of claim 1, further comprising:
an air filter device positioned in the airflow channel.

7. An Information Handling System (IHS), comprising:
a processing system; and
a memory system that is coupled to the processing system and that includes instructions that, when executed by the processing system, cause the processing system to provide a networking engine that is configured to perform networking functionality;
a first transceiver device port that is coupled to the processing system; and
a transceiver device that is connected to the first transceiver device port, wherein the transceiver device includes:
at least one heat producing component; and
a transceiver device handle that defines an airflow channel along its length, defines an airflow channel entrance to the airflow channel, and is configured to:
extend past at least one cable such that airflow to the airflow channel via the airflow channel entrance is not obstructed by the at least one cable;
receive airflow at the airflow channel entrance;
direct the airflow through the airflow channel; and
dissipate heat generated by the at least one heat producing component using the airflow directed through the airflow channel.

8. The IHS of claim 7, further comprising:
a heat dissipation device that is integrated on the transceiver device and that is configured to receive the heat generated by the at least one heat producing component, wherein the transceiver device handle is configured to direct the airflow from the airflow channel through the heat dissipation device to dissipate the heat generated by the at least one heat producing component.

9. The IHS of claim 7, wherein the transceiver handle is configured to direct the airflow from the airflow channel adjacent the at least one heat dissipating component to dissipate the heat generated by the at least one heat producing component.

10. The IHS of claim 7, wherein a heat dissipation device that extends from the first transceiver device port and that is configured to receive the heat generated by the at least one heat producing component and transmitted via the transceiver device to the first transceiver device port, wherein the transceiver device handle is configured to direct the airflow from the airflow channel through the heat dissipation device to dissipate the heat generated by the at least one heat producing component.

11. The IHS of claim 10, wherein the airflow channel defined by the transceiver device handle includes a primary airflow portion that extends from the airflow channel entrance, and a secondary airflow portion that redirects airflow towards the heat dissipation device.

12. The IHS of claim 7, further comprising:
an air filter device positioned in the airflow channel.

13. The IHS of claim 7, wherein at least one cable is coupled to a respective second transceiver device port that is provided in a rack with the first transceiver device port.

14. A method for dissipating heat generated by a transceiver device using airflow channeled via a transceiver device handle, comprising:
extending, by a transceiver device handle on a transceiver device when the transceiver device is coupled to a first transceiver device port, past at least one cable such that airflow to an airflow channel defined by the transceiver device handle via an airflow channel entrance defined by the transceiver device handle is not obstructed by the at least one cable;
receiving, by the transceiver device handle, airflow at the airflow channel entrance;
directing, by the transceiver device handle, the airflow through the airflow channel; and
dissipating, using the airflow directed through the airflow channel by the transceiver device handle, heat generated by at least one heat producing component included in the transceiver device.

15. The method of claim 14, wherein a heat dissipation device is integrated on the transceiver device, and wherein the airflow is directed from the airflow channel through the heat dissipation device to dissipate the heat generated by the at least one heat producing component.

16. The method of claim 14, wherein the airflow is directed from the airflow channel into the transceiver device to dissipate the heat generated by the at least one heat producing component.

17. The method of claim 14, wherein the transceiver device is connected to the first transceiver device port that includes a heat dissipation device extending from the first transceiver device port, and wherein the airflow is directed from the airflow channel through the heat dissipation device to dissipate the heat generated by the at least one heat producing component.

18. The method of claim 17, wherein the airflow channel defined by the transceiver device handle includes a primary airflow portion that extends from the airflow channel entrance, and a secondary airflow portion that redirects airflow towards the heat dissipation device.

19. The method of claim 14, further comprising:
filtering, by an air filter device positioned in the airflow channel, the airflow that is directed through the airflow channel.

20. The method of claim 14, wherein
each at least one cable is coupled to a respective second transceiver device port that is provided in a rack with the first transceiver device port.

* * * * *